(12) United States Patent
Moriya et al.

(10) Patent No.: US 7,108,474 B2
(45) Date of Patent: Sep. 19, 2006

(54) APPARATUS FOR TRANSPORTING PLATE-SHAPED WORK PIECE

(75) Inventors: Susumu Moriya, Shiga-ken (JP);
Shigeto Murayama, Shiga-ken (JP);
Yuichi Morimoto, Shiga-ken (JP);
Yoshiteru Ikehata, Shiga-ken (JP);
Takayoshi Ohno, Shiga-ken (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 10/823,408

(22) Filed: Apr. 13, 2004

(65) Prior Publication Data

US 2005/0002743 A1    Jan. 6, 2005

(30) Foreign Application Priority Data

| Apr. 14, 2003 | (JP) | ............................. 2003-109137 |
| Jul. 3, 2003 | (JP) | ............................. 2003-270686 |
| Jul. 8, 2003 | (JP) | ............................. 2003-271947 |
| Jul. 15, 2003 | (JP) | ............................. 2003-274874 |

(51) Int. Cl.
*B65G 49/06* (2006.01)

(52) U.S. Cl. ........................ 414/676; 406/85; 406/86; 406/88

(58) Field of Classification Search ................ 414/676; 406/85, 86, 88
See application file for complete search history.

(56) References Cited

U.S. PATENT DOCUMENTS

| 3,731,823 | A | * | 5/1973 | Goth | ............................. 406/88 |
| 3,734,567 | A | * | 5/1973 | Fong | ............................. 406/86 |
| 4,355,940 | A | * | 10/1982 | Derickson | .................... 414/439 |
| 4,618,295 | A | * | 10/1986 | Dugge et al. | ................ 406/138 |
| 4,630,975 | A | * | 12/1986 | Becker | ........................ 406/85 |
| 5,037,245 | A | * | 8/1991 | Smith | .......................... 406/88 |
| 5,584,614 | A | * | 12/1996 | Aidlin et al. | .................. 406/88 |
| 6,183,186 | B1 | * | 2/2001 | Howells et al. | ........ 414/416.03 |
| 6,241,427 | B1 | * | 6/2001 | Hessburg et al. | .............. 406/88 |
| 6,676,365 | B1 | * | 1/2004 | Adam et al. | ................... 406/83 |
| 6,808,358 | B1 | * | 10/2004 | Mayerberg et al. | ......... 414/676 |
| 6,907,755 | B1 | * | 6/2005 | Langsdorf et al. | ......... 65/182.2 |

FOREIGN PATENT DOCUMENTS

| JP | 2000-62951 | 2/2000 |
| JP | 2002-151571 | 5/2002 |
| JP | 2002-176091 | 6/2002 |
| JP | 2002-289670 | 10/2002 |
| JP | 2002-308421 | 10/2002 |
| JP | 2002-308423 | 10/2002 |
| JP | 2002-321820 | 11/2002 |

* cited by examiner

*Primary Examiner*—Douglas A. Hess
(74) *Attorney, Agent, or Firm*—The Webb Law Firm

(57) ABSTRACT

It is an object to provide a plate-shaped work piece transporting apparatus provided with a blowing mechanism for contactlessly supporting a plate-shaped work piece that is transported, where the blowing mechanism is provided with a dust-removal filter and a blowing mechanism for sending air to the lower surface of the plate-shaped work piece via the dust-removal filter. In a first embodiment, a driving mechanism for contacting the plate-shaped work piece and moving it in the transporting direction is provided.

27 Claims, 26 Drawing Sheets

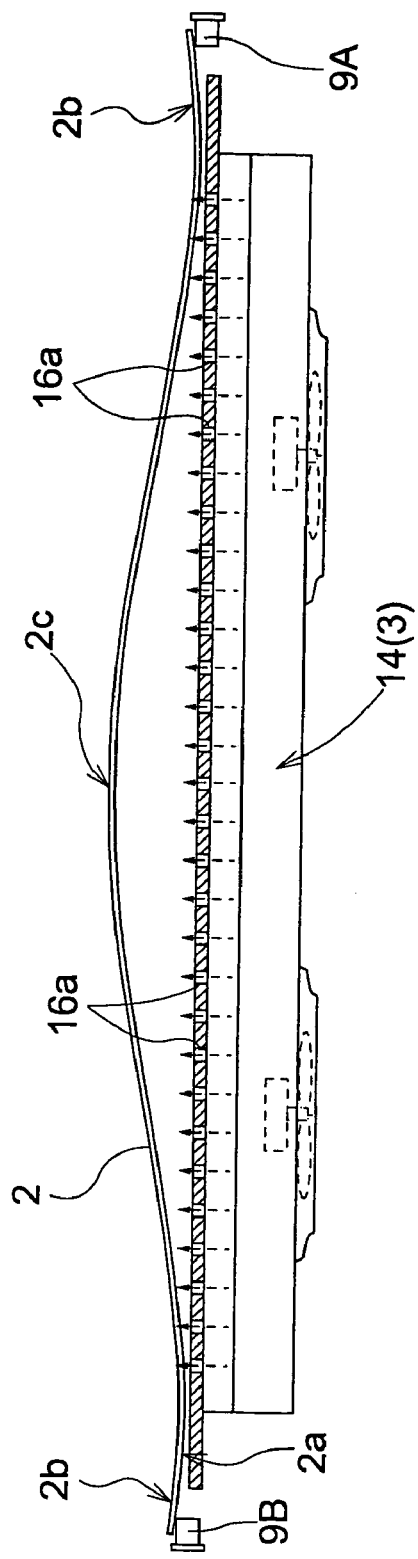
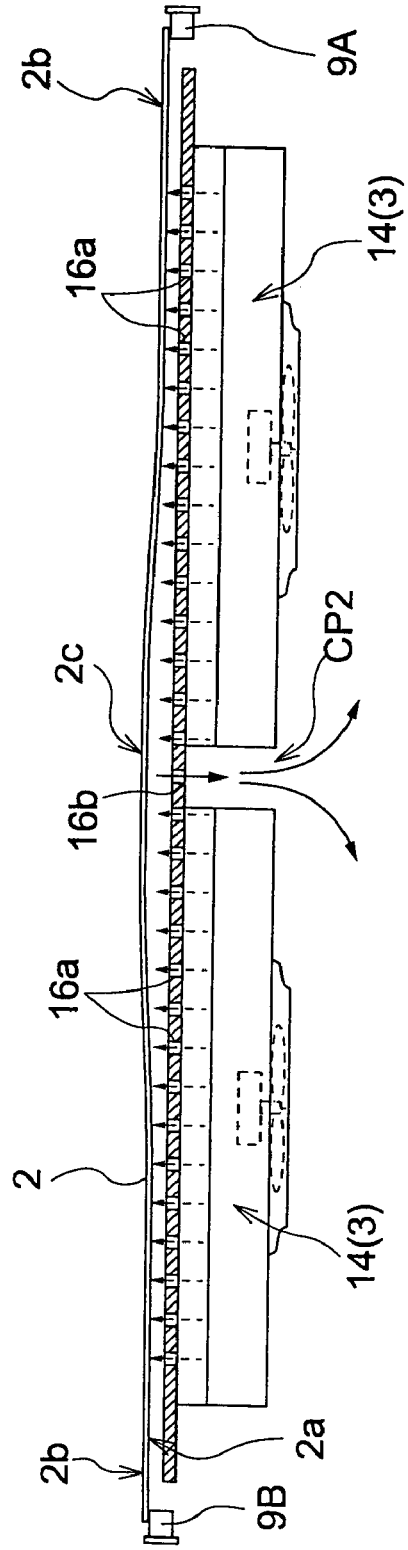
FIG.14(A)
FIG.14(B)

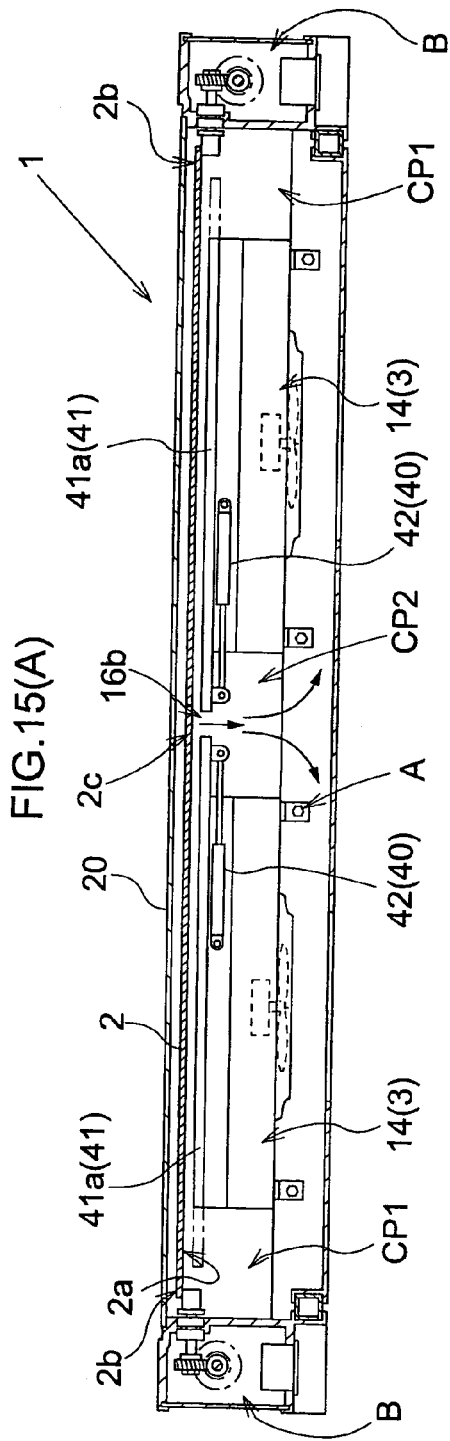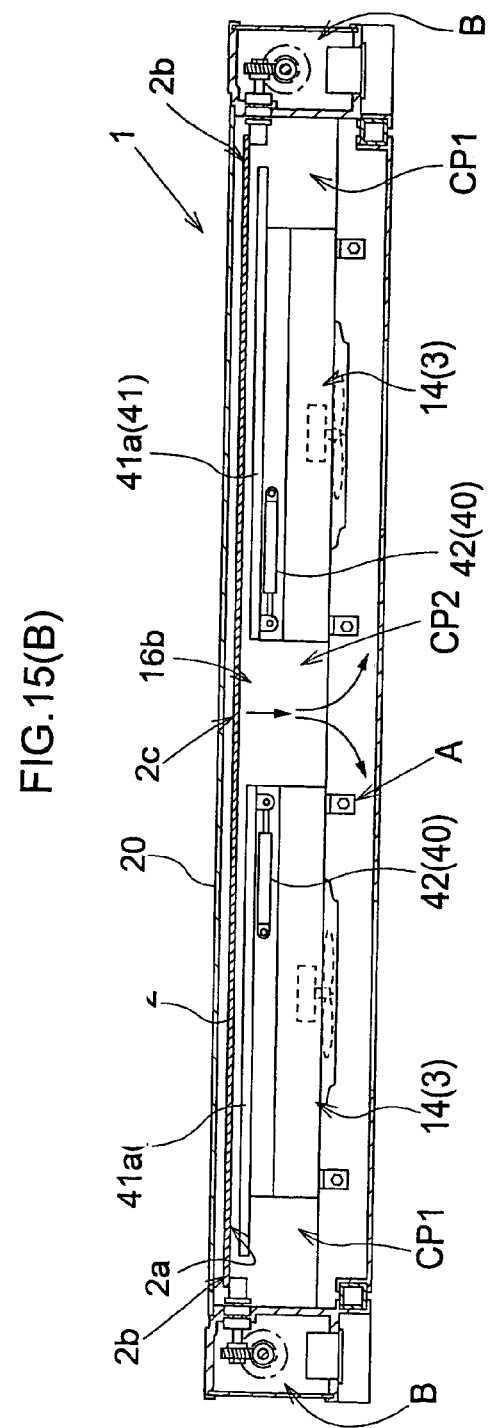

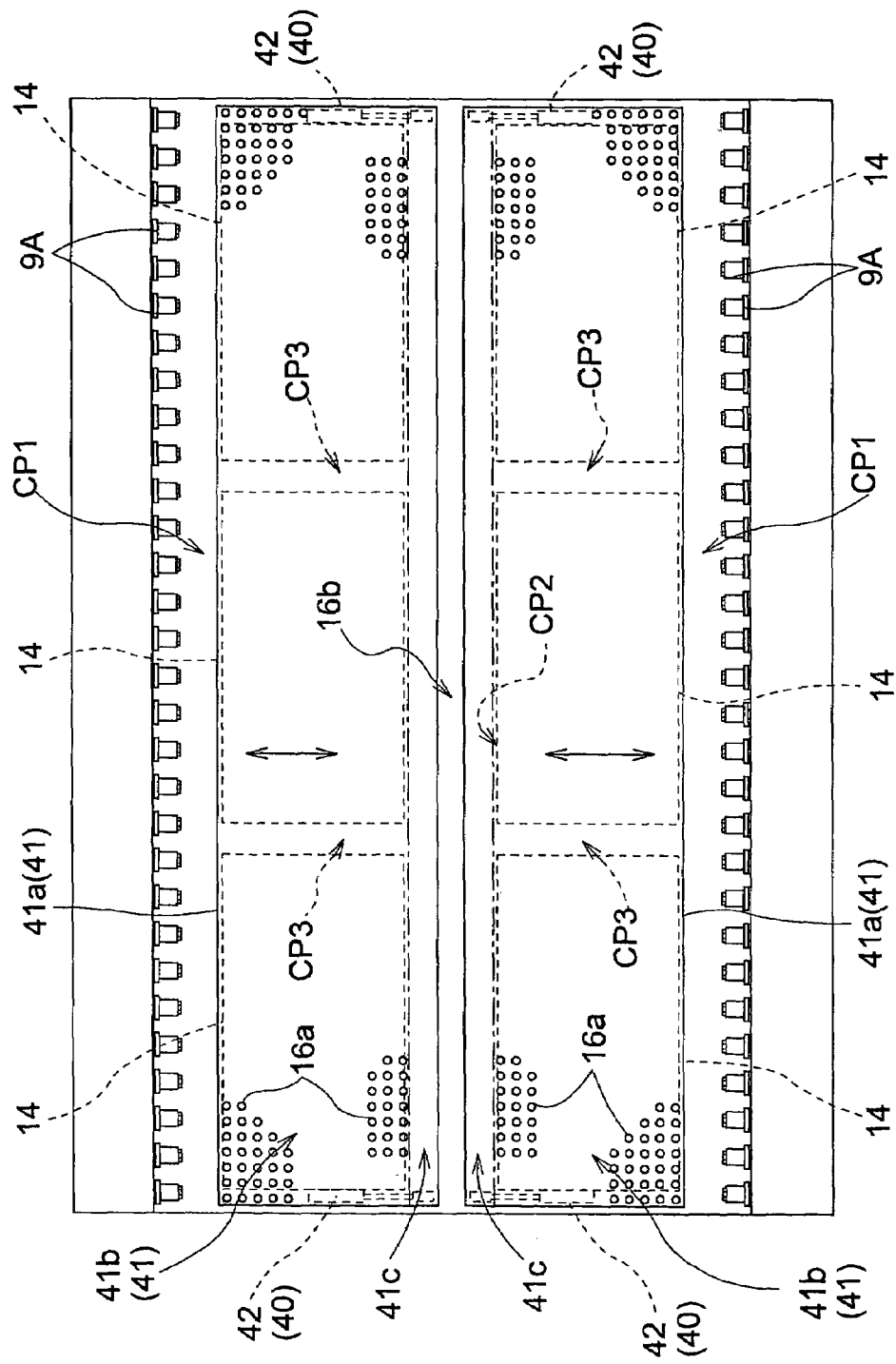

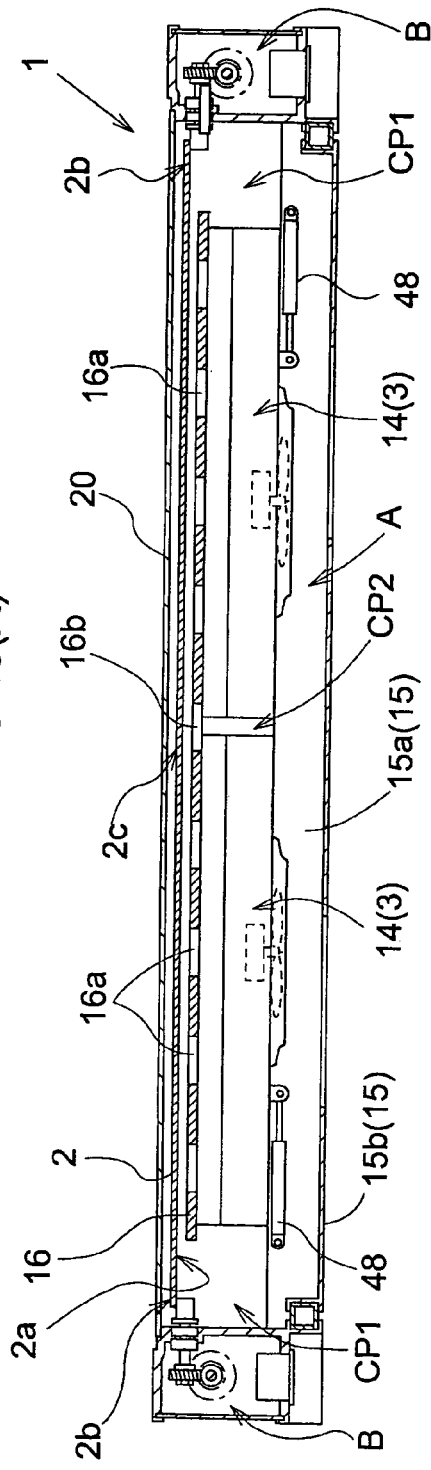
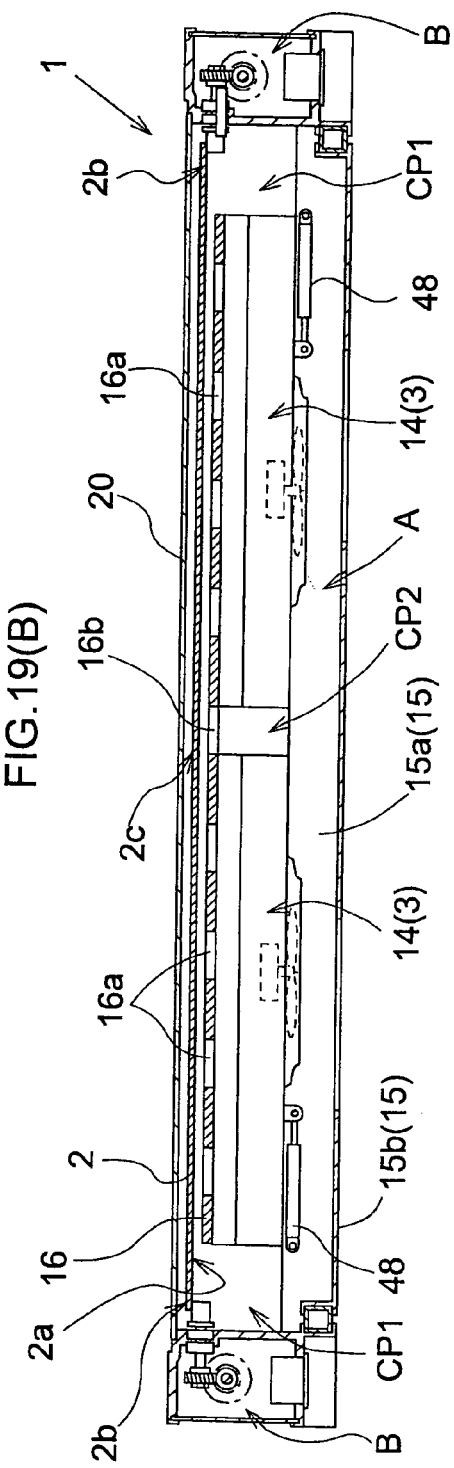

APPARATUS FOR TRANSPORTING PLATE-SHAPED WORK PIECE

BACKGROUND OF THE INVENTION

The present invention relates to apparatuses for transporting plate-shaped work piece which are provided with an air-supplying-type support means that supplies filtered air toward a lower surface of a plate-shaped work piece that is transported so as to contactlessly support the plate-shaped work piece.

Such apparatuses for transporting plate-shaped work piece are used to transport plate-shaped work pieces such as liquid crystal glass substrates. Conventional apparatuses are provided with a drive force application means that applies a drive force in a transporting direction in order to transport a plate-shaped work piece in a horizontal or substantially horizontal orientation. The drive force application means is provided with drive rotors that support both end portions of the plate-shaped work piece in a contacting manner while applying a drive force. The plate-shaped work piece is transported in a horizontal or substantially horizontal orientation, with an intermediate portion thereof supported by the air-supplying-type support means and both end portions of the plate-shaped work piece supported in a contacting manner by the drive rotors. The air-supplying-type support means is provided with numerous air ejection holes provided at a predetermined spacing along the route over which the plate-shaped work piece is transported, and an air supply source including a compression pump, for example, and the supply source and the air ejection portions are connected by a supply duct such that compressed air from the supply source is distributively supplied to the numerous air ejection portions. Moreover, the air-supplying-type support means was designed such that compressed air ejected from the air ejection portions is supplied onto an intermediate portion located between the end portions of the plate-shaped work piece so as to contactlessly support the intermediate portion of the plate-shaped work piece (for example, see JP 2002-321820A).

In an apparatus for transporting a plate-shaped work piece in a vertical or near vertical orientation, the drive force application means applying drive force in the transporting direction is provided with a drive rotor for supporting a lower end portion of the plate-shaped work piece in a contacting manner while applying a drive force, and the lower end portion is supported in a contacting manner by the drive force application means, whereas an intermediate portion of the plate-shaped work piece transported in a vertical or near vertical orientation is supported by the air-supplying-type support means. The air-supplying-type support means is provided with numerous air ejection portions provided at a predetermined spacing along the route over which the plate-shaped work piece is transported, and an air supply source including an air blower, for example, and the supply source and the air ejection portions are connected by supply ducts such that compressed air from the supply source is distributed and supplied to the numerous air ejection portions, and the air-supplying-type support means is configured such that compressed air that is ejected from the air ejection portions is supplied to the intermediate portion of the plate-shaped work piece so as to contactlessly support the intermediate portion of the plate-shaped work piece(for example, see JP 2002-308423A).

With conventional plate-shaped work piece transporting apparatuses, the air-supplying-type support means is designed so that the air supply source and the numerous air ejection portions lined up in the transporting direction are connected by a supply duct, and this necessitated the complex task of connecting the supply source and the numerous air ejection portions so that compressed air does not leak out, making fabrication of the plate-shaped work piece transporting apparatus complicated.

When the route over which the plate-shaped work piece is transported is long, the number of air ejection portions that are provided at a predetermined spacing in the transporting direction increases, and thus, supply sources also are provided at a predetermined spacing in the transporting direction and compressed air is independently supplied to the numerous air ejection portions by the plurality of supply sources. Providing a plurality of supply sources in this manner makes the structure accordingly complicated, and leads to the disadvantage that space for disposing the plurality of supply sources becomes necessary, for example.

Also, with conventional technologies, the amount of air that the air-supplying-type support means supplies toward the lower surface portion of the transported object is constant, and thus the air-supplying-type support means is used only for contactlessly supporting the transported object. Consequently, conventional transporting apparatuses do not allow the transported object to be contactlessly supported and transported at the same time, and thus cannot be adopted to handle different circumstances.

Moreover, with conventional technologies, the air-supplying-type support means is located below the plate-shaped work piece that is transported, and thus the route that passes between the plate-shaped work piece and the air-supplying-type support means and discharges to the side of the air-supplying-type support means is the only discharge route for the filtered air that is supplied onto the lower surface of the plate-shaped work piece, and since the filtered air is not easily discharged it easily pools below an intermediate portion of the plate-shaped work piece. Due to this pooling of air, the plate-shaped work piece is transported in a deformed state in which its intermediate portion bulges upward, and thus a large burden is placed on the plate-shaped work piece.

SUMMARY OF THE INVENTION

The present invention was arrived at in light of the foregoing problems, and it is an object thereof to provide a plate-shaped work piece transporting apparatus that allows manufacturing to be simplified. The apparatus for transporting plate-shaped work pieces according to the present invention is provided with an air-supplying-type support means for contactlessly supporting the plate-shaped work piece, and the air-supplying-type support means is provided with a dust-removal filter for removing dust and an air-supplying means for supplying filtered air toward the lower surface of the plate-shaped work piece through the dust-removal filter. With this structure it is possible to provide an apparatus for transporting a plate-shaped work piece with a simple structure that allows the resistance of the dust-removal filter to be utilized to make the air from the air-supplying means uniform.

A further object of the present invention, as defined in a dependent claim, is to provide a transporting apparatus that is compatible with situations other than that of transporting while contactlessly supporting a transported object. To achieve this object, a plate-shaped work piece transporting apparatus as defined in a dependent claim is capable of switching an air supply amount of air that is supplied toward a lower surface portion of the transported object between a first air supply amount for contactlessly supporting the transported object and a set air supply amount that is different from the first air supply amount. Consequently, the air-supplying-type support means can be used not only for contactlessly supporting the transported object but also for other applications as well.

A further object of the present invention, as defined in a dependent claim, is to provide a plate-shaped work piece transporting apparatus that allows the burden on the plate-shaped work piece due to the supply of filtered air from the air-supplying-type support means to be reduced. To achieve this object, a plate-shaped work piece transporting apparatus as defined in a dependent claim has a circulation path, formed in the air-supplying-type support means at an intermediate location in the width direction perpendicular to the transporting direction of the plate-shaped work piece, for discharging downward the filtered air supplied to the lower surface of the plate-shaped work piece. Consequently, it is easier to discharge filtered air below the intermediate portion of the plate-shaped work piece, and thus filtered air is less likely to pool below the intermediate portion of the plate-shaped work piece. Thus, the plate-shaped work piece that is transported is transported in a substantially horizontal orientation in which bulging at its intermediate portion is inhibited, allowing the burden on the plate-shaped work piece to be reduced.

BRIEF DESCRIPTION OF THE DRAWINGS

FIG. 14 is an operation diagram showing how the plate-shaped work piece bulges;

FIG. 15 is a front surface view of the discharged air amount adjustment means according to a separate embodiment;

FIG. 16 is a plan view of the discharged air amount adjustment means according to a separate embodiment;

FIG. 19 is a front view of the discharged air amount adjustment means according to a separate embodiment;

DETAILED DESCRIPTION OF THE INVENTION

An apparatus for transporting plate-shaped work pieces according to the present invention is described below with reference to the drawings. A liquid crystal glass substrate is used as an example of the plate-shaped work piece. Several embodiments are described below, but features disclosed in the each of the embodiments are not limited to use in only that embodiment, and as long as there are no contradictions, these features can be suitably applied to other embodiments as well.

Figure 1:
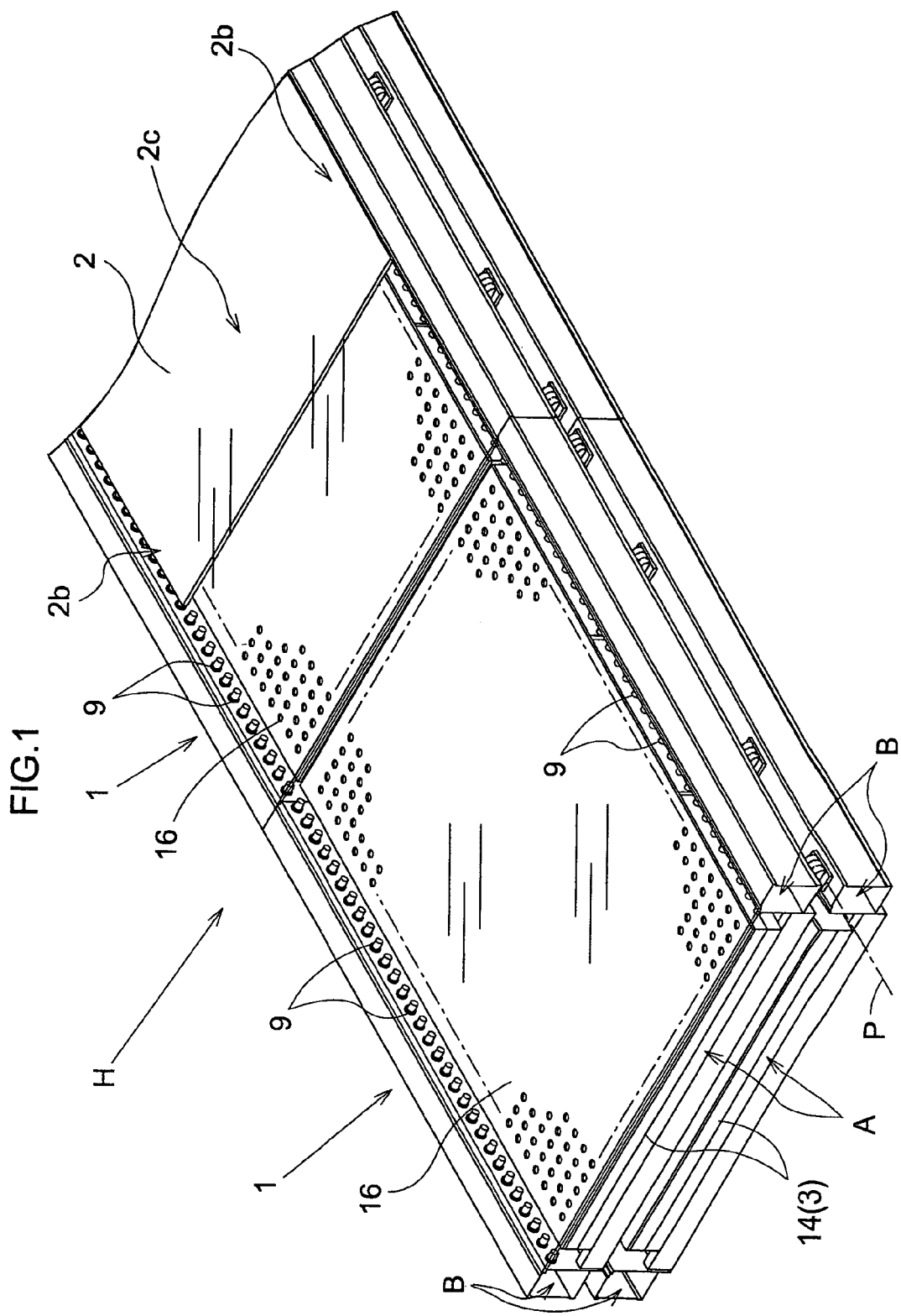
FIG. 1 is a perspective diagram of the plate-shaped work piece transporting apparatus of the first embodiment.

As shown in FIG. 1, a plate-shaped work piece transporting apparatus H is provided with a plurality of transporting units 1 lined up in a transporting direction of a glass substrate 2. The glass substrate 2 is automatically or manually placed on the transporting unit 1 positioned on the up-stream side, and is supported by an air-supplying-type support means 3 and a drive force application means 4 as it is transported from the up-stream side toward the down-stream side by the drive force application means 4.

Figure 2:
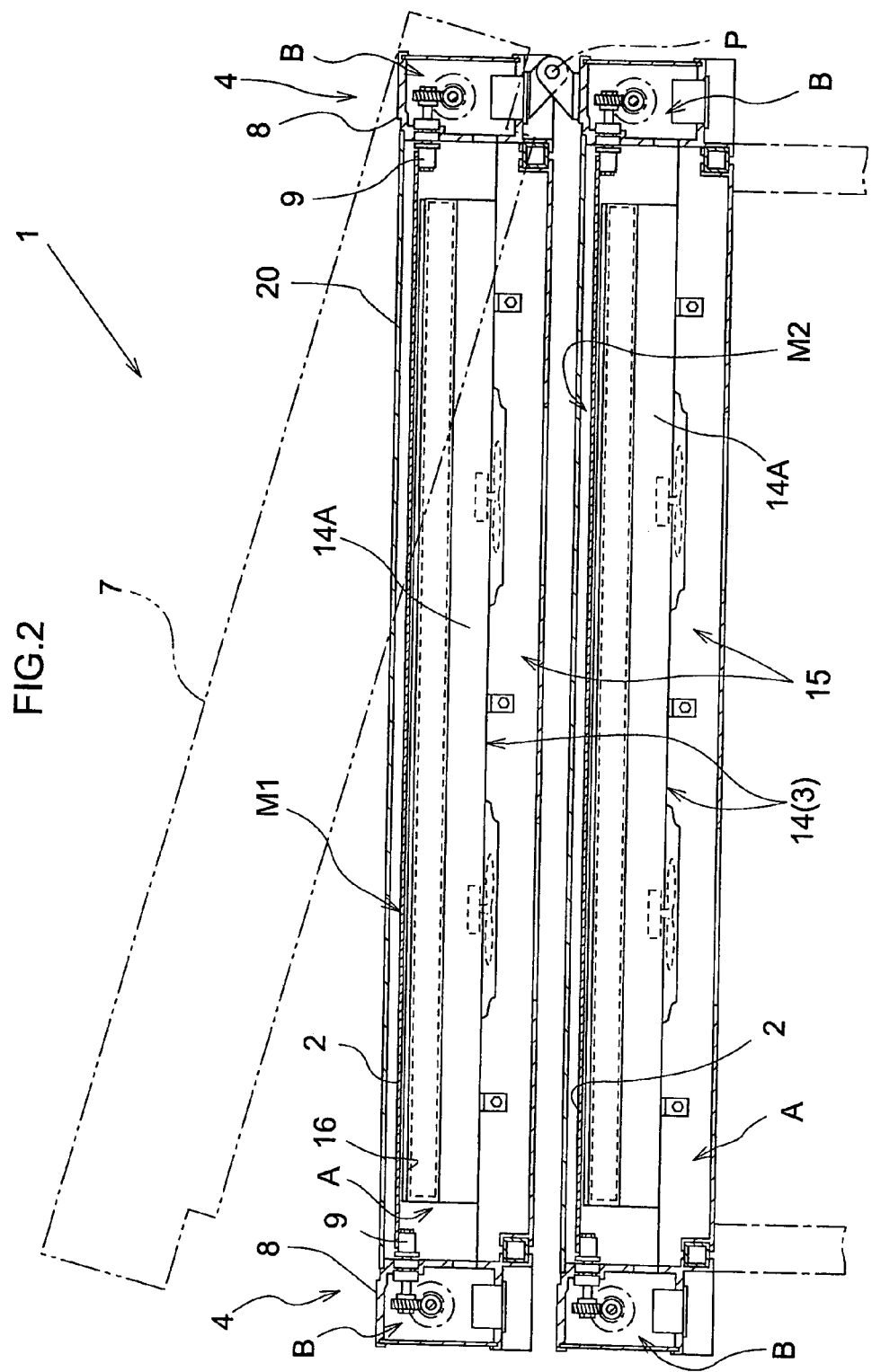
FIG. 2 is a front sectional view of the plate-shaped work piece transporting apparatus of the first embodiment.
Figure 3:
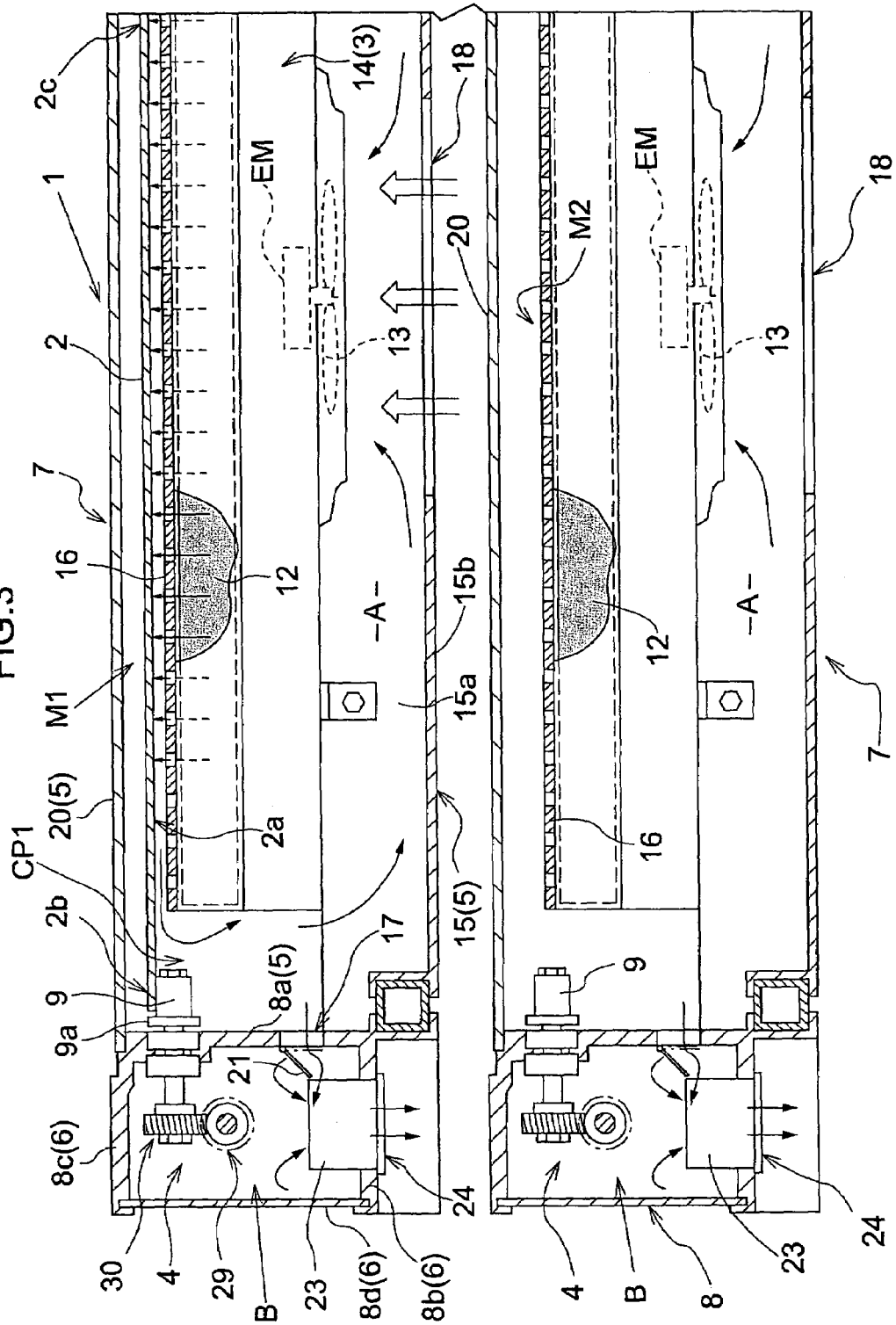
FIG. 3 is a partial magnified view of the front sectional view of the plate-shaped work piece transporting apparatus of the first embodiment.

The glass substrate 2 that has been transported to the transporting unit 1 positioned on the down-stream side is transferred to another location by a transferring machine or the like. As shown in FIG. 1 to FIG. 3 and described later, the plate-shaped work piece transporting apparatus H has portions M1 and M2 with identical structures that are disposed on two levels in the vertical direction.

As shown in FIG. 2 and FIG. 3, each transporting unit 1 is provided with an air-supplying-type support means 3 for supplying filtered air toward a lower surface 2a of the glass substrate 2, which is transported in a horizontal or substantially horizontal orientation, so as to contactlessly support the glass substrate 2, a drive force application means 4 for applying a drive force in the transporting direction to the glass substrate 2, the drive force application means 4 being provided with drive rollers 9 serving as drive rotors that support the end portions 2b of the glass substrate 2 in a contacting manner while applying a drive force thereto, and a case member 7 covering a transport space A and an accommodation space B, which are discussed later, in a substantially airtight manner.

Figure 4:
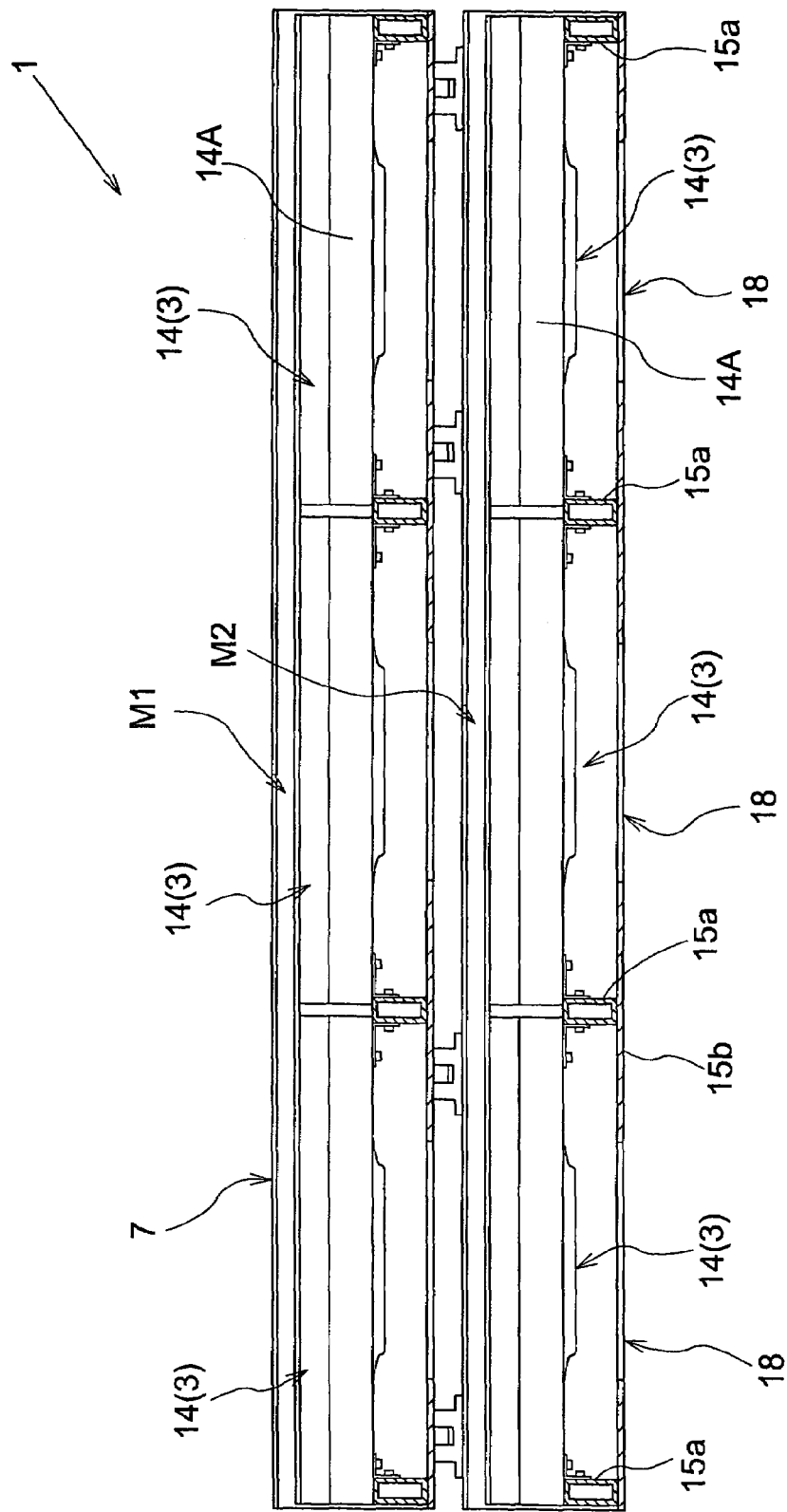
FIG. 4 is a lateral sectional view of the transport space in the first embodiment.

As shown in FIG. 3 and FIG. 4, the air-supplying-type support means 3 comprises fan-filter units 14 arranged in a line in the transporting direction of the glass substrate 2. The type of units that are disposed on the back of storage apparatuses, used in a clean room, for supplying clean air into storage space are used as the fan-filter units 14. The fan-filter units 14, which serve as air-supplying units, are formed by integrally combining a dust-removal filter 12, which is an ultra low penetration air (ULPA) filter for removing dust, and blowing fans 13 serving as air-supplying means for supplying filtered air toward the lower surface 2a of the glass substrate 2 through the dust-removal filter 12, by accommodating and supporting the dust-removal filter 12 and the blowing fans 13 within a housing 14A. That is, the fan-filter units 14 in the air-supplying-type support means 3 are provided with two blowing fans 13 lined up in the width direction, which is perpendicular to the transporting direction, of the glass substrate 2, a single dust-removal filter 12 covering an upper side of the two blowing fans 13, and an air rectifying plate 16 serving as a plate-shaped porous member for rectifying the filtered air that passes through the dust-removal filter 12. The air rectifying plates 16 are also supported to the housing 14A. The blowing fans 13 are electrical fans that are rotatively driven by an electrical motor EM. The air rectifying plate 16 is provided over its entire surface with through holes 16a formed by a punching press.

The blowing fans 13 suck in air from below and supply that air directly upward, where the dust removal filter 12 is positioned. The air that is supplied directly upward passes through the dust-removal filter 12 and is supplied through the through holes 16a of the air rectifying plate 16 directly onto an intermediate region 2c in the width direction, which is perpendicular to the transporting direction, of the lower surface 2a of the glass substrate 2 as filtered air, supporting the intermediate region 2c of the glass substrate 2 by this filtered air. The fan-filter units 14 suck in air within a transport casing 5 and supply this air that has been sucked in toward the lower surface of the glass substrate 2 through the dust-removal filter 12 as filtered air, circulating the air within the transport space A.

The case member 7 is provided with a unit frame member 15 substantially rectangular in planar view that supports the fan-filter units 14, a pair of left and right accommodation frames 8 provided in the transporting direction at the respective end portions of the unit frame member 15, and a transporting cover 20 that extends from the upper end portion of the right accommodation frame 8 to the upper end portion of the left accommodation frame 8. As shown in FIG. 3, each accommodation frame 8 is provided with an accommodation cover 8d formed substantially bracket-shaped if viewed in the transporting direction and which is on the side opposite the transport space A side, provided with an upper wall 8c, and lower wall 8b, and an inner wall 8a on the transport space A side.

As shown in FIG. 3, a transport casing 5 that covers the transport space A accommodating the air-supplying-type support means 3, the drive force application means 4, and the transport route for the glass substrate 2 in a substantially airtight manner comprises the unit frame member 15, the inner walls 8a of the accommodation frames 8, and the transporting cover 20. An accommodation case 6 that covers the accommodation space B, which accommodates an the electric motor 10 of the drive force application means 4, in a substantially airtight manner includes the upper wall 8c, the lower wall 8b, and the accommodation cover 8d. It should be noted that the transport space A and the accommodation space B are in communication with one another between the transporting unit 1 on the up-stream side and the transporting unit 1 on the down-stream side arranged lined up in the transporting direction, the up-stream side end portion of the transport space A and the accommodation space B of the transporting unit 1 positioned on the most up-stream side in the plate-shaped work piece transporting apparatus H is closed off by the transport casing 5 and the accommodation case 6, and the down-stream side end portion of transport space A and the accommodation space B of the transporting unit 1 positioned on the down-stream side in the plate-shaped work piece transporting apparatus H is closed off by the transport casing 5 and the accommodation case 6. The upper area of the transport space A can be opened by removing the transporting cover 20, and lateral surfaces of the accommodation space B can be opened by removing the accommodation cover 8d.

The unit frame member 15 is constituted by a support frame portion 15a having a frame member and a plate-shaped frame member 15b positioned below the support frame portion and provided with an air introduction opening 18 serving as an air introduction portion for introducing outside air into the transport space A. The inner wall 8a of the accommodation frame 8 is provided with an air discharge opening 17 serving as an air discharge portion for discharging some of the air in the transport space A into the accommodation section B. Also, an outside discharge opening 24 for discharging the air in the accommodation space B to the outside is formed in the lower wall 8b of the accommodation frame 8. The outside discharge opening 24 is provided with a sub-fan-filter unit 23 as an outside discharge means having a blowing function and a dust-removal function.

The transport space A and the accommodation space B are in communication through the air discharge opening 17, and air that is discharged from the air discharge opening 17 passes through the air discharge opening 17 and is discharged into the accommodation space B. The air discharge opening 17 is provided with a check valve 21 that allows air to flow from the transport space A side to the accommodation space B side and prevents the flow of air from the accommodation space B side toward the transport space A side.

That is, due to the blowing action of the blowing fans 13, air is circulated within the transport space A and outside air is guided into the transport space A from the air introduction opening 18, and moreover, by discharging some of the air circulating within the transport space A into the accommodation space B from the air discharge opening 17, some of the air that is circulated within the transport space A is exchanged. The air that is discharged into the accommodation space B is sucked in by the sub-fan-filter unit 23, dust is removed from the air, and the air is discharged to the outside from the outside discharge opening 24.

Consequently, air within the transport space A is circulated as follows. Air within the transport space A is sucked in by the blowing fans 13 and is supplied toward the lower surface 2a of the glass substrate 2 as filtered air after passing through the dust-removal filter 12 and the air rectifying plate 16. Outside air is introduced into the transport space A from the air introduction opening 18, increasing the pressure within the transport space A, and thus some of the air circulating within the transport space A is discharged from the air discharge opening 17 to the accommodation space B, and some is discharged to the outside from the gap between the accommodation frame 8 and the transporting cover 20, for example, exchanging some of the air circulating within the transport space A. Consequently, since the air pressure within the transport space A increases, the infiltration of air within the accommodation section B from the air discharge opening 17 and outside air from the gap between the accommodation frame 8 and the transporting cover 20, for example, can be prevented, and due to the exchange of some of the air within the transport space A, a rise in temperature within the transport space A can be inhibited.

Also, with the accommodation space B, air within the accommodation space B is discharged to the outside from the outside discharge opening 24 by the sub-fan-filter unit 23, and due to the drop in pressure inside the accommodation space B, air is introduced into the accommodation space B from the gap between the upper wall 8c and the accommodation cover 8d or from the air discharge opening 17, for example, exchanging some of the air within the accommodation space B. Consequently, since the air pressure within the accommodation space B is reduced, air can be kept from moving out from the accommodation space B from the air discharge opening or the gap between the upper wall 8c and the accommodation cover 8d, for example, and due to the exchange of some of the air within the accommodation space B, the temperature within the accommodation space B can be kept from rising.

Figure 5:
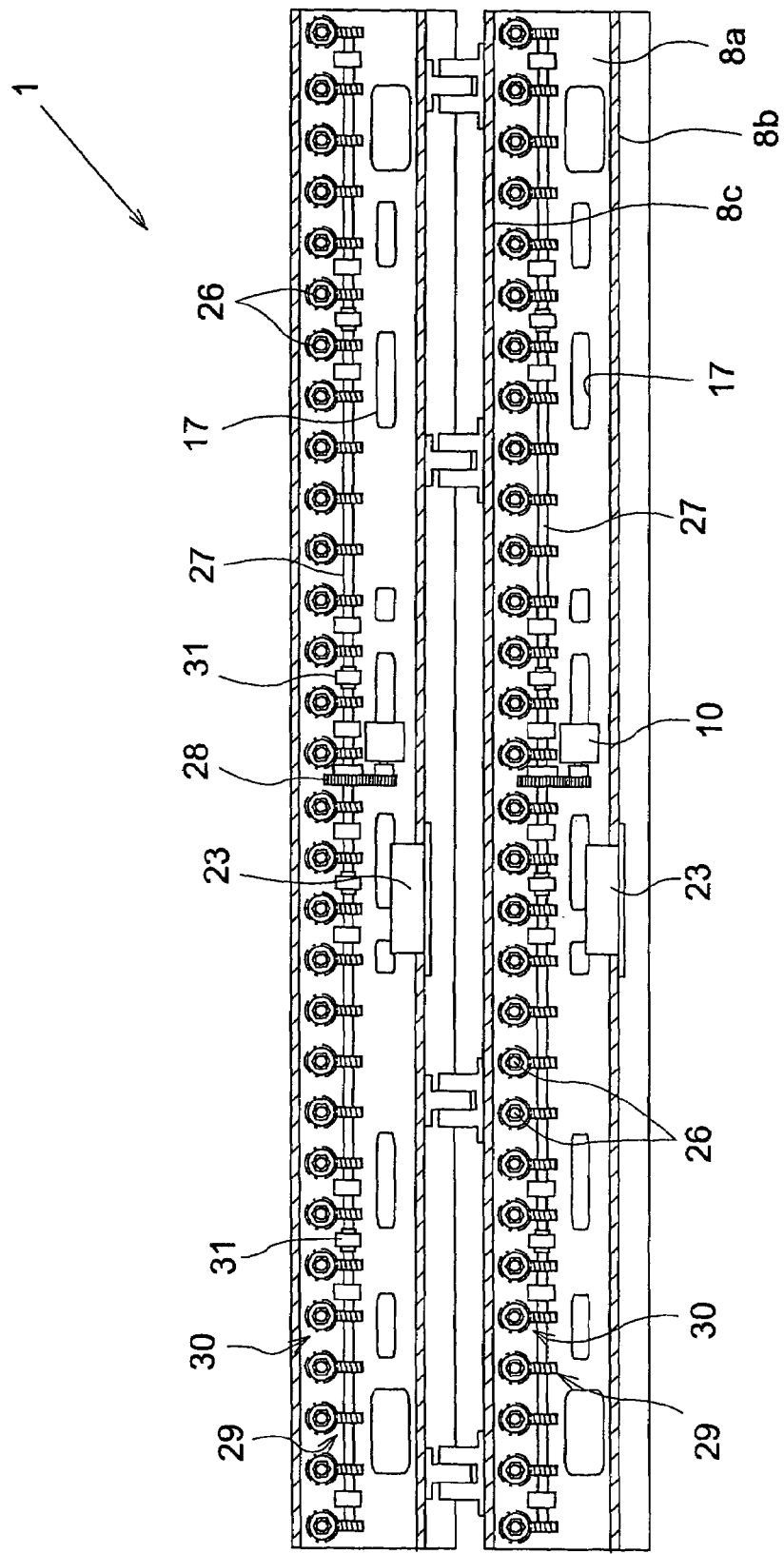
FIG. 5 is a lateral sectional view of the accommodation space in the first embodiment.
Figure 6:
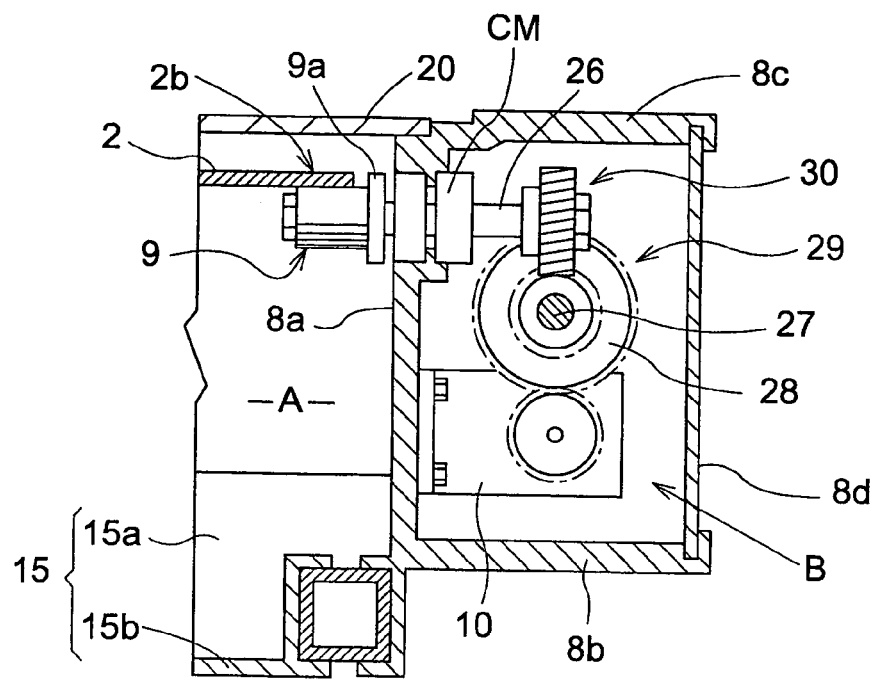
FIG. 6 is a front sectional view of a drive force application means of the first embodiment.
Figure 7:
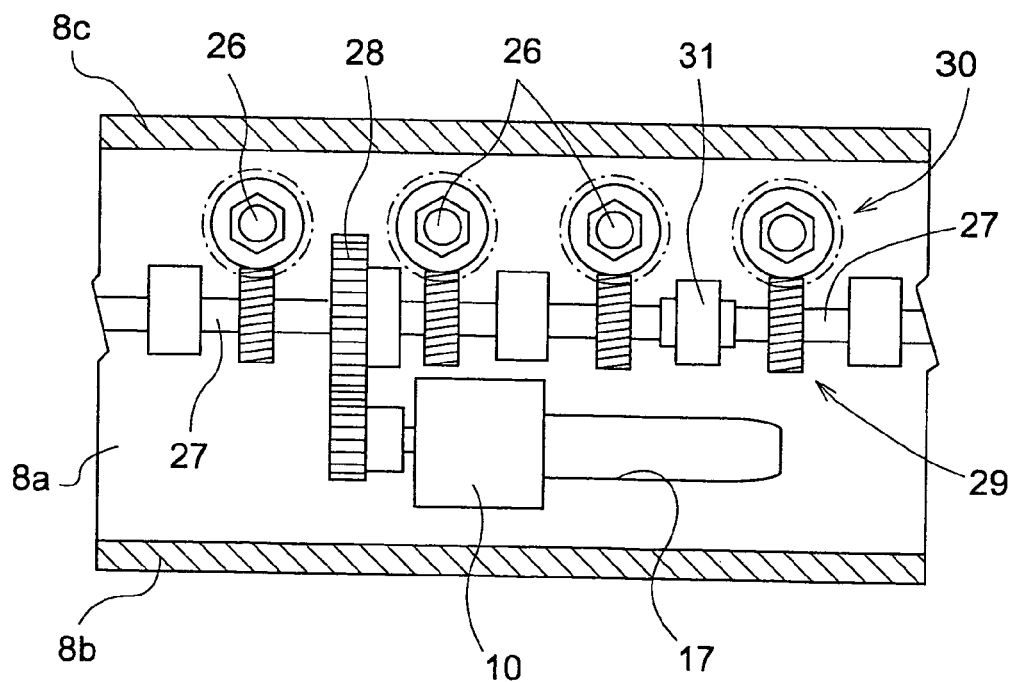
FIG. 7 is a lateral sectional view of a drive force application means of the first embodiment.

The drive force application means 4 is described next with reference to FIGS. 5 to 8. As shown in FIG. 5, a plurality of power transmission shafts 27 lined up in the transporting direction and operatively linked to one another by couplings 31 and the electric motor 10 are provided within the accommodation space B. Also, numerous output shafts 26 each projecting into the accommodation space B and the transport space A are rotatively supported on the inner wall 8a of the accommodation frame 8 with a gap between them in the transporting direction. The drive rollers 9, which are provided with a large diameter portion 9a, are provided at the portion of the output shafts 26 that project into the transport space A. Input gear portions 30 configured as screw gears are provided at the portion of the output shafts 26 that projects toward the accommodation space B. A spur gear 28 is provided on one of the numerous power transmission shafts 27. The spur gear 28 engages with the gear portion of the power transmission motor 10. The power transmission shafts 27 are provided with output gear portions 29 for each of the numerous output shafts 26, and these engage with the input gear portions 30 of the output shafts 26.

In other words, the drive force application means 4 is provided with the electric motor 10, the output shafts 26, the power transmission shafts 27, and the drive rollers 9, and is configured such that the drive rollers 9 are rotatively driven by the drive force of the electric motor 10. The output shafts 26 are rotatively supported on the inner wall 8a of the accommodation frame 8 via collar members CM.

Consequently, as shown in FIG. 3, the glass substrate 2 is supported at both end portions 2b by the drive rollers 9 of the drive force application means 4 in a contacting manner, and its intermediate portion 2c is contactlessly supported by the filtered air of the air-supplying-type support means 3, and it is transported in the transporting direction due to the drive force that is applied by the drive rollers 9, which are rotatively driven. At this time, misalignment in the direction intersecting the transporting direction is restricted by the large diameter portion 9a of the drive rollers 9.

As shown in FIG. 1 and FIG. 2, the plate-shaped work piece transporting apparatus H is provided with two upper and lower transporting portions M1 and M2 for transporting the glass substrate 2, and the upper transporting portion M1 of the upper and lower transporting portions M1 and M2 is configured such that it can be swingably manipulated upward about one end side in order to open the upper area of the lower transporting portion M2. That is, each transporting unit is provided with a transport casing 5 for its upper and lower levels, and each transport casing 5 accommodates either the transporting portion M1 or M2 comprising the air-supplying-type supporting device 3 and the drive force application means 4, for example. By swinging the upper transport casing 5 upward about an axis P, the upper transport casing 5 and the upper transporting portion M both are swung upward, opening the upper area of the lower transport casing 5, and by removing the cover 20 of the lower transport casing 5, the inside of the transport space A can be made accessible for maintenance from above. To perform maintenance on the accommodation space B, the accommodation cover 8d is removed to open up the accommodation space B and allow maintenance to be performed.

It should be noted that as regards the manner in which the upper and lower level transporting portions M1 and M2 are employed, the transporting directions of the upper transporting portion M1 and the lower transporting portion M2 are opposite directions, with the glass substrate 2 being transported from a transport source to a transport destination by the upper transporting portion M1, and the glass substrate 2 for which the same process is performed or defective glass substrates, for example, can be transported from the transport destination to the transport source by the lower transporting portion M2. Alternatively, it is also possible to adopt a configuration in which the upper transporting portion M1 and the lower transporting portion M2 have identical transporting directions where plate-shaped work pieces are transported from the transport source to the transport destination by the upper transporting portion M1 and the lower transporting portion M2.

Figure 8:
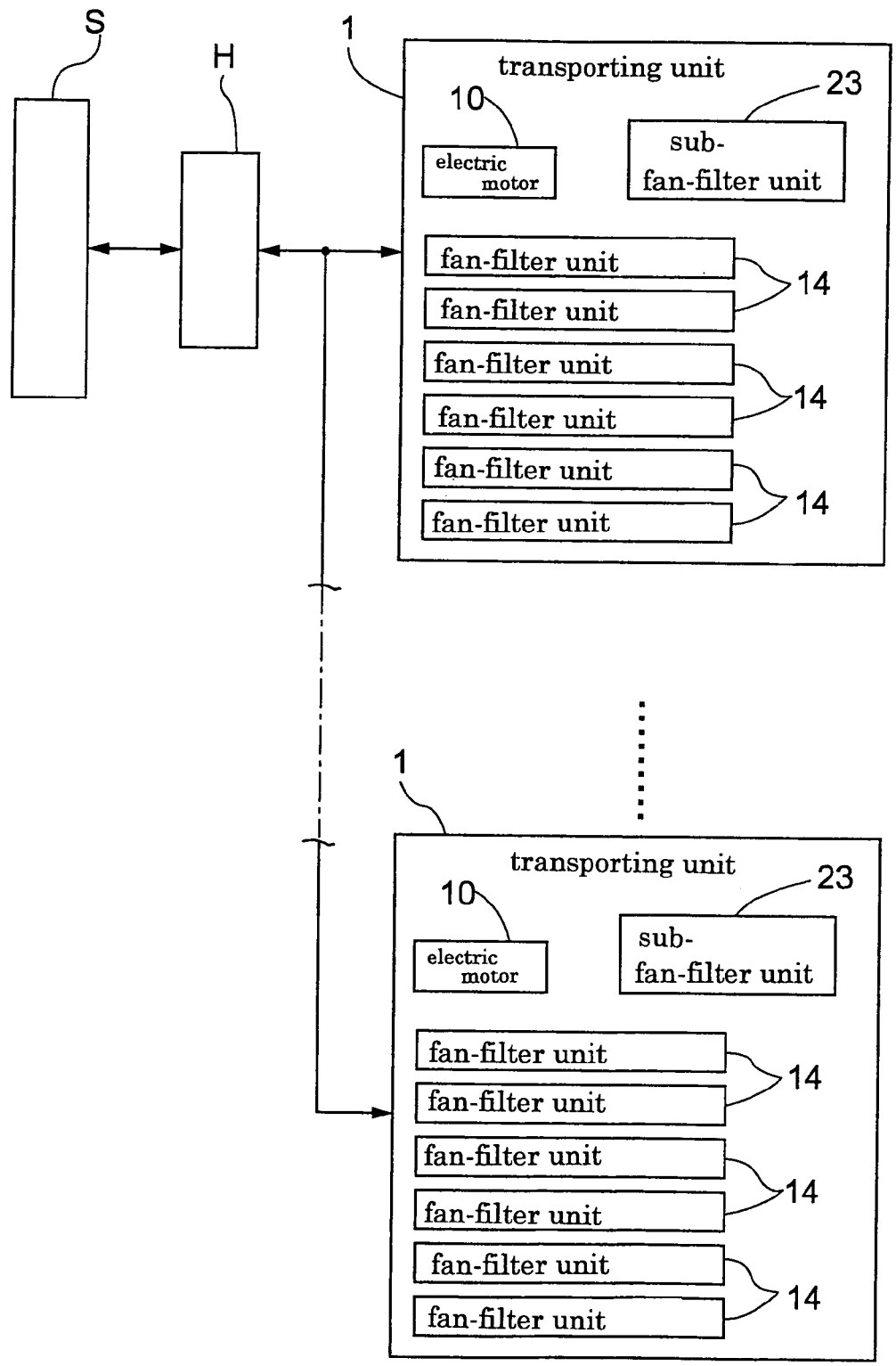
FIG. 8 is a control block diagram of the transporting apparatus of the first embodiment.
Figure 9:
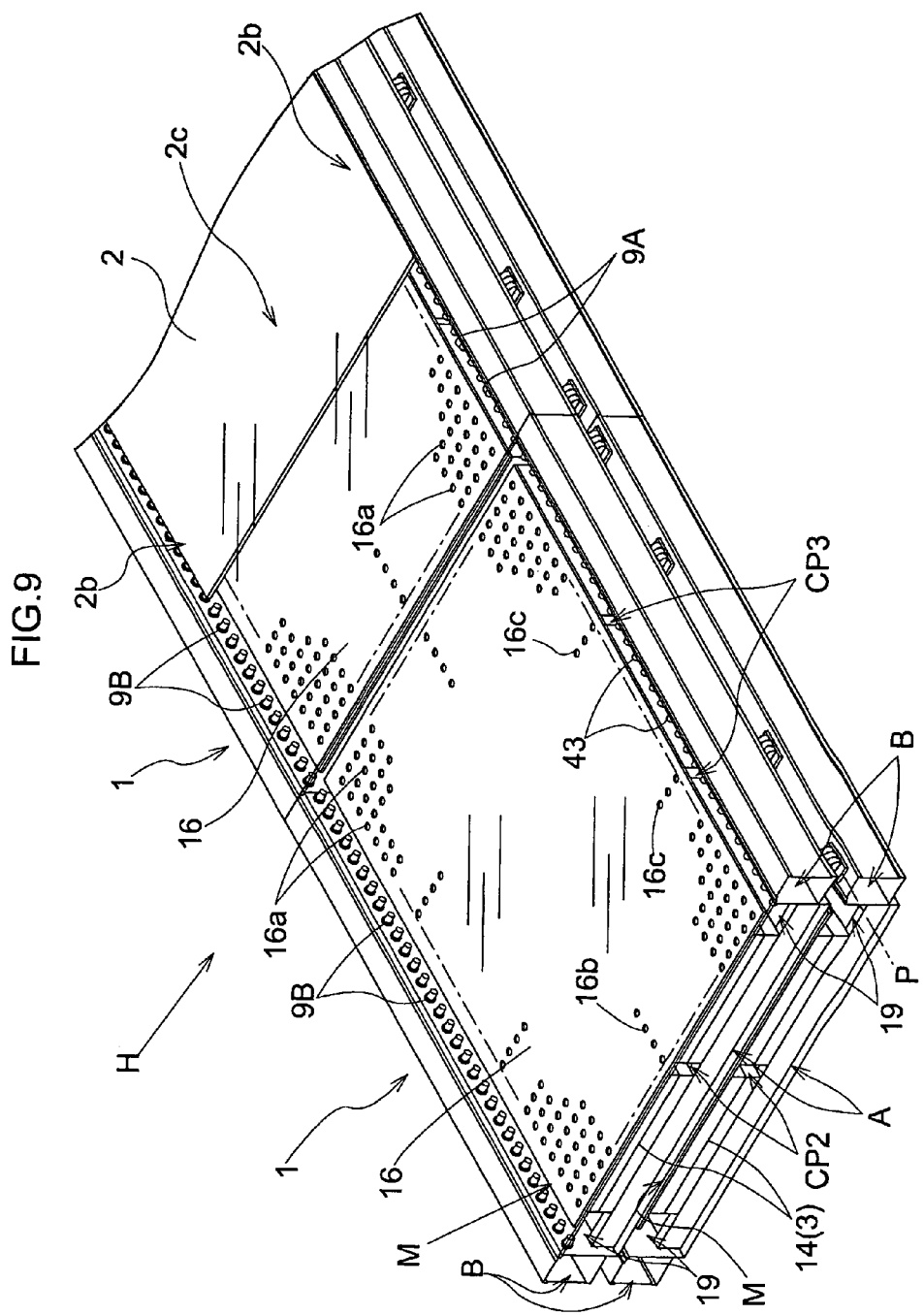
FIG. 9 is a perspective diagram of the plate-shaped work piece transporting apparatus of the second embodiment.

As shown in FIG. 8, the control member H of the plate-shaped work piece transporting apparatus, in accordance with a command from an operation command switch S, controls the starting and stopping of operation of the electric motor EM, the operating state of the fan-filter units 14, and the starting and stopping of operation of the sub-fan-filter unit 23 for each of the plurality of control units 1.

The blowing fans 13 in the fan-filter units 14 are configured such that, in accordance with a command from the operation command switch S, the amount of air that is supplied toward the lower surface portion of the glass substrate 2 can be changed between a support air supply amount for contactlessly supporting the glass substrate 2 and an air supply amount that is different from the support air supply amount. More specifically, the blowing fans 13 are configured such that the air supply amount can be freely changed between a plurality of air supply amounts including the support air supply amount, a set air supply amount that is less than the support air supply amount, and a set air supply amount that is greater than the support air supply amount.

The control member H is configured such that when it receives a command to start transporting from the operation command switch S, it starts operation of the electric motor 10 of the drive force application means 4 and the sub-fan-filter unit 23, and starts operation of the blowing fans 13 so that the amount of air that is blown toward the lower surface portion of the glass substrate 2 becomes the support air supply amount. Also, the control member H is configured such that when it receives a command for small air supply amount operation from the operation command switch S, for example, it starts operation of the blowing fans 13, without operating the electric motor 10, so that the amount of air that is blown toward the lower surface portion of the glass substrate 2 becomes the small setting air supply amount. In this case, it is possible either to operate or not to operate the sub-fan-filter unit 23.

Moreover, the control member H is configured such that when it receives a command for large air amount operation from the operation command switch S, for example, it starts operation of the blowing fan 13 without operating the electric motor 10 so that the amount of air that is blown toward the lower surface portion of the glass substrate 2 becomes a large setting air supply amount. In this case, it is possible either to operate or not to operate the sub-fan-filter unit 23.

The operation command switch S is capable of providing separate commands to the plurality of transporting units 1, and can provide the same command to all of the plurality of transporting units 1 and it can provide individually different commands to the plurality of transporting units 1.

Regarding the operation command switch S for the blowing fans 13 that is mentioned above, the same command is sent to all of the plurality of transporting units 1, and the blowing fans 13 perform the same operation in all of the transporting units 1.

The number of air supply amounts which can be set can be altered, where necessary, to a number other than the three disclosed above.

It should be noted that although not shown, with a predetermined plate-shaped work piece transporting apparatus 1 positioned on the down-stream side there are gaps formed between the fan-filter units 14 lined up in the transporting direction so that arm portions of a transferring machine for transferring plate-shaped work pieces to another location can be inserted therein. Also, the plate-shaped work piece transporting apparatus 1 is provided with an ionizer for neutralizing negative ions that are generated by the plate-shaped work piece transporting apparatus 1.

SECOND EMBODIMENT

A second embodiment is described next. Structural components identical to those of the first embodiment are assigned identical reference numerals and description thereof is omitted.

Figure 12:
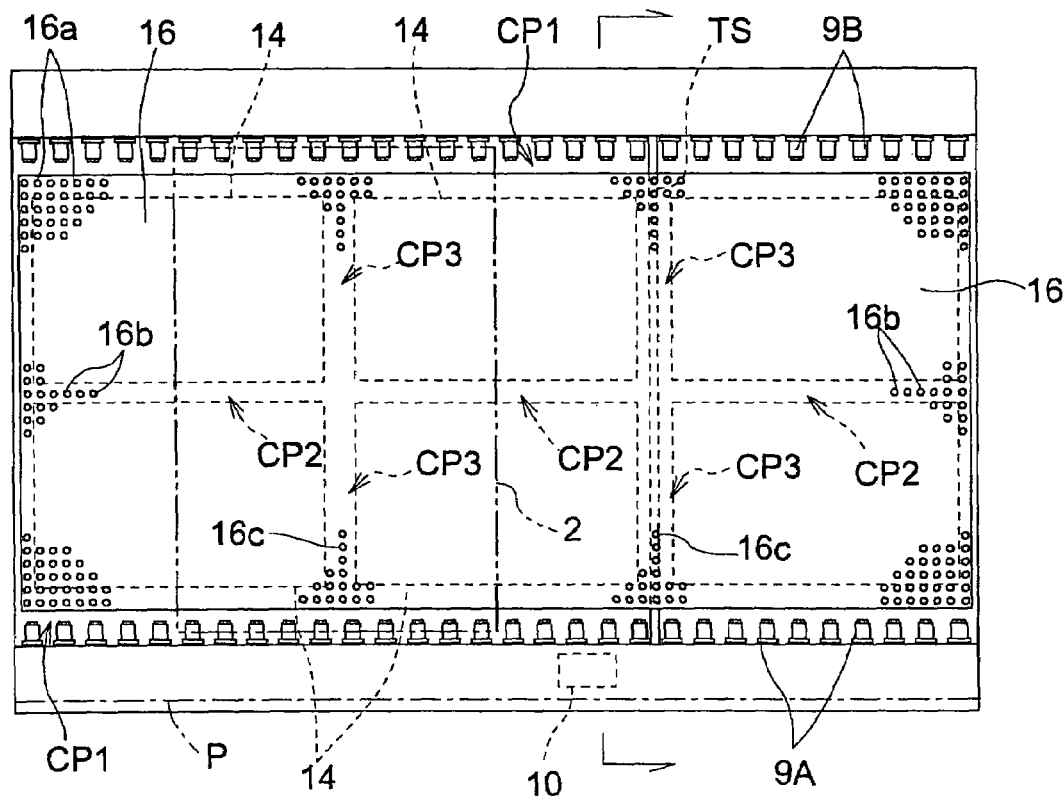
FIG. 12 is a plan view of the plate-shaped work piece transporting apparatus of the second embodiment.

In the first embodiment, fan-filter units 14 each having two blowing fans 13 and lined up in the width direction perpendicular to the transporting direction of the glass substrate 2 were disclosed. The width in the width direction of the fan-filter units 14 disclosed in the second embodiment is approximately half the width of that disclosed in the first embodiment, and each fan-filter unit 14 is provided with a single blowing fan 13. Consequently, as shown in FIG. 12, the air-supplying-type support means 3 is constituted by a total of six fan-filter units 14, three arranged in the transporting direction by two arranged in the width direction. The type of units that are disposed on the back of storage apparatuses, used in a clean room, for supplying clean air into storage space are used as the fan-filter units 14 in this embodiment as well.

Figure 10:
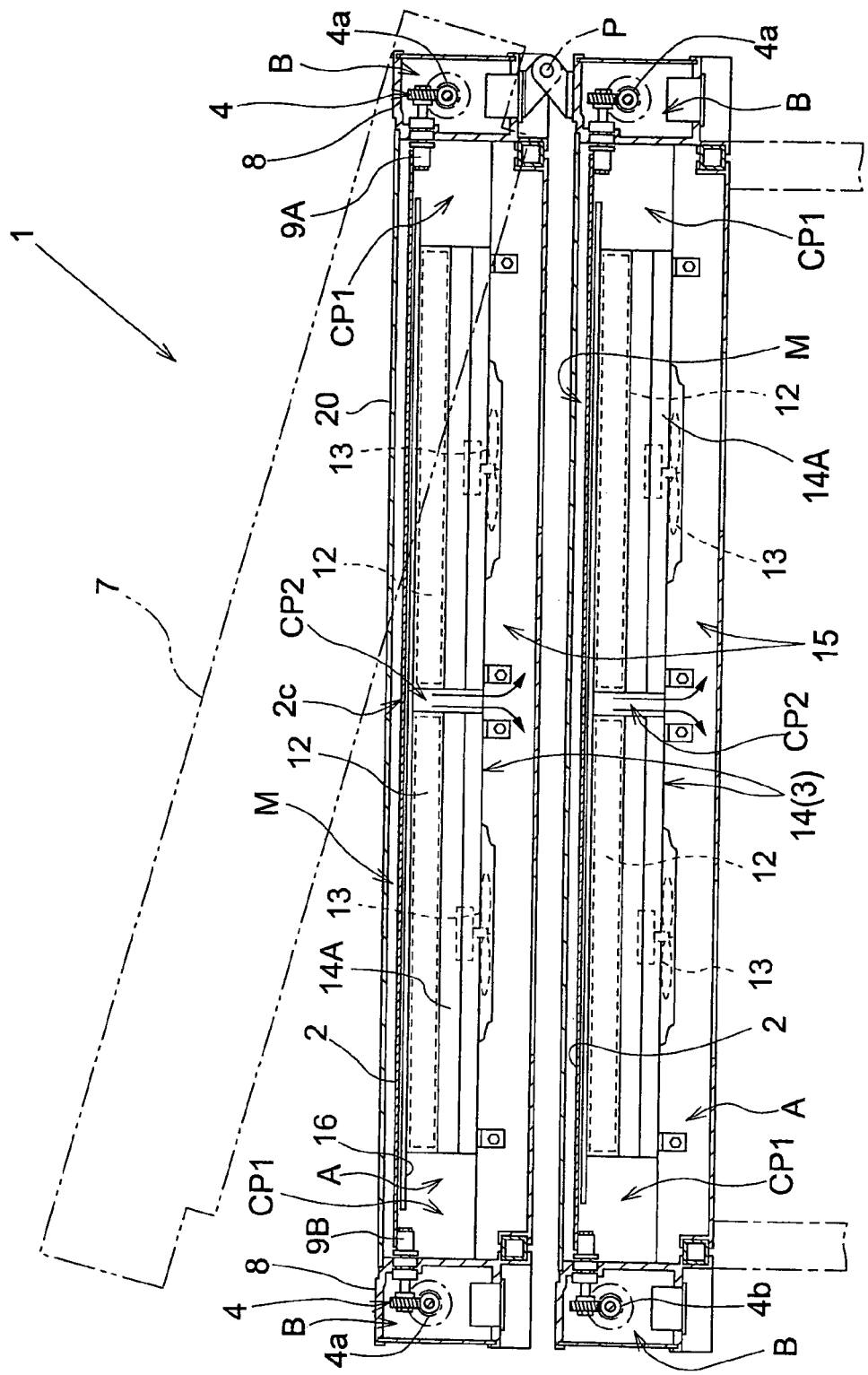
FIG. 10 is a front sectional view of the plate-shaped work piece transporting apparatus of the second embodiment.
Figure 11:
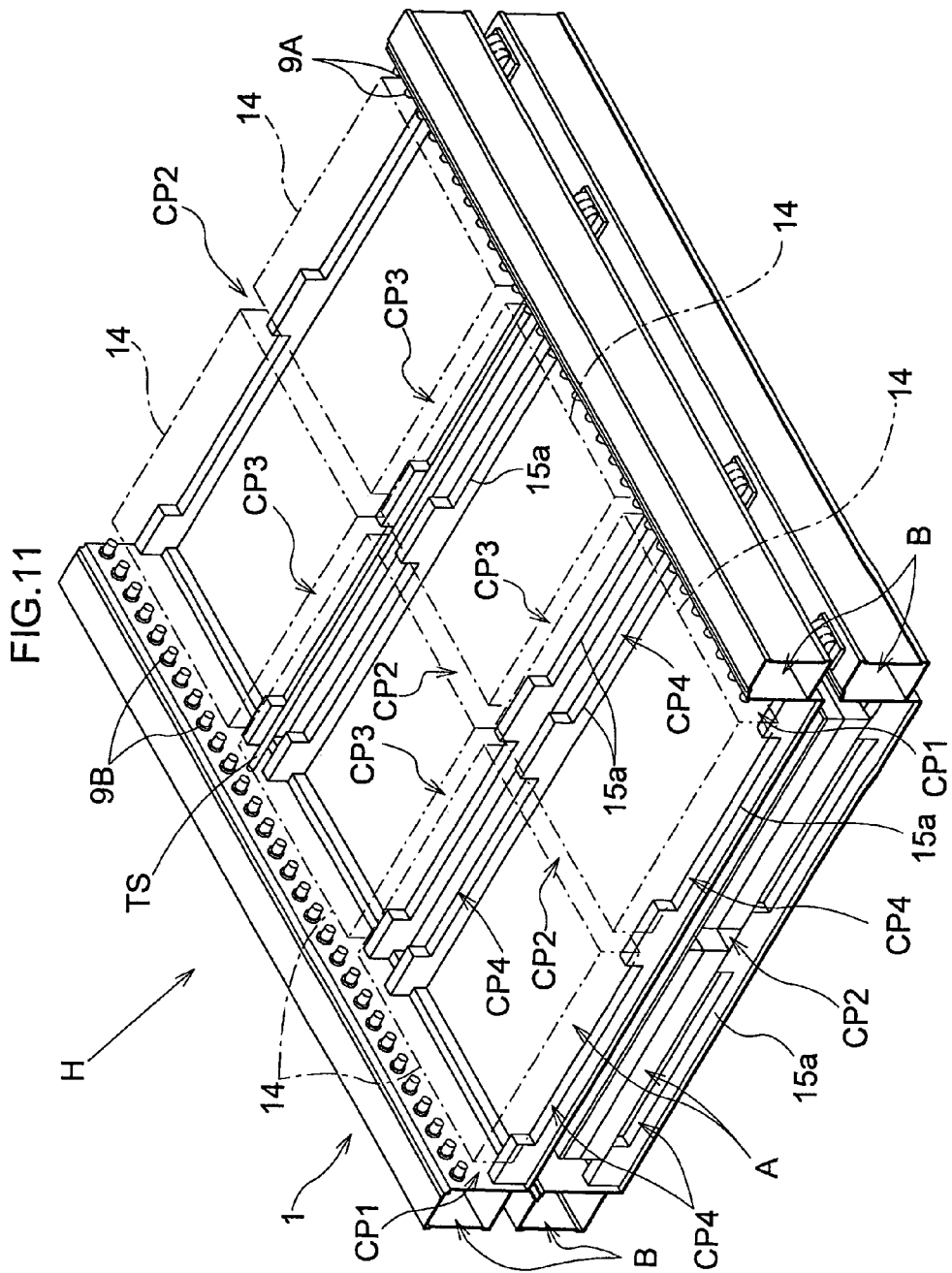
FIG. 11 is a perspective view of the transporting unit of the second embodiment.

Also, as shown in FIG. 10, with the fan-filter units 14 placed on and supported by the unit frame member 15, a first circulation path CP1 is formed between the fan-filters 14 and the accommodation frame 8 positioned next to the fan-filter units 14 on their width side. A second circulation path CP2 is formed by separating the fan-filter units 14 lined up in the width direction. A third circulation path CP3 is formed by separating the fan-filter units 14 lined up in the transporting direction. The first circulation path CP1, the second circulation path CP2, and the third circulation path CP3 are in communication with one another. Additionally, as shown in FIG. 12, second through holes 16b are formed by punching press in the portion of the air rectifying plate 16 that is located directly above the second circulation path CP2. Third through holes 16c are formed by punching press in the portion of the air rectifying plate 16 that is located directly above the third circulation path CP3.

Consequently, as regards the path over which filtered air that is supplied toward the lower surface 2a of the glass substrate 2 is discharged to the space below the blowing fan 13, there is the path passing over the first circulation path CP1 between the air-supplying-type support means 3 and the accommodation frame 8 located on the width side thereof, as well as the path passing over the second circulation path CP2 between the fan-filter units 14 lined up in the width direction via the second through holes 16b, and the path passing over the third circulation path CP3 between the fan-filter units 14 lined up in the transporting direction via the third through holes 16c. Consequently, filtered air that pools below the intermediate region 2c of the plate-shaped work piece 2 can be discharged downward over the path that passes over the second circulation path CP2 in particular so as to keep the intermediate region 2c of the plate-shaped work piece from bulging upward.

That is, as shown in FIG. 14A, if the second circulation path CP2 is not formed at an intermediate location in the width direction of the air-supplying-type support means 3, then filtered air tends to pool between the air-supplying-type support means 3 and the plate-shaped work piece 2 at an intermediate position in the width direction of the air-supplying-type support means 3, and the plate-shaped work piece 2 is transported with its intermediate region 2c bulging upward. However, forming the second circulation path CP2 at an intermediate location in the width direction of the air-supplying-type support means 3 allows filtered air to be discharged from the second circulation path CP2 at an intermediate location in the width direction of the air-supplying-type support means 3 as shown in FIG. 14B, making filtered air less prone to pooling between the plate-shaped work piece 2 and the air-supplying-type support means 3 and keeping the plate-shaped work piece 2 from bulging upward at its intermediate region 2c, allowing it to be transported in a substantially horizontal posture.

The drive force application means 4 for applying a drive force in the transporting direction to the glass substrate 2 according to the second embodiment is described next. The drive force application means 4 is provided with a plurality of drive rollers 9A serving as drive rotors for supporting an end side of the glass substrate 2 in a contacting manner, a plurality of driven rollers 9B serving as driven rotors for supporting the other end side in a contacting manner, the electric motor 10 serving as a driving mechanism for the drive rollers 9A, and a transmission shaft TS serving as a transmission mechanism for transmitting the motive force of the electric motor 10 to the driven rollers 9B. The drive force application means 4 applies a drive force while supporting, in a contacting manner, both end portions 2b of the glass substrate 2 in a horizontal or substantially horizontal orientation using the drive rollers 9A and the driven rollers 9B. The transmission shaft TS is disposed in the third circulation path CP3.

Figure 13:
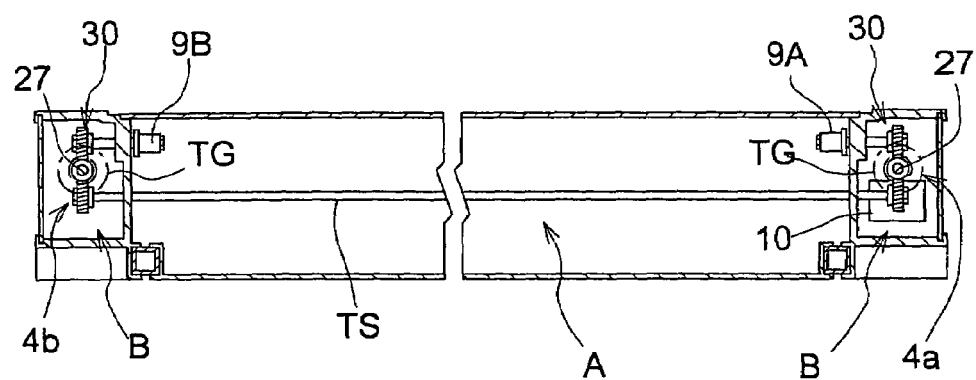
FIG. 13 is a plan view showing the transmission mechanism of the second embodiment.

As shown in FIG. 12 and FIG. 13, transmission gears TG are provided for one power transmission shaft 27 of a drive-side drive force application mechanism 4a and one power transmission shaft 27 of a driven-side drive force application mechanism 4b. Motive force is transmitted from the transmission gear TG of the drive-side drive force application mechanism 4a to the transmission gear TG of the driven-side drive force application mechanism 4b due to operative linking by the transmission shaft TS.

Consequently, the drive rollers 9A are rotatively driven by the motive force of the electric motor 10, and the driven rollers 9B also are rotatively driven by the motive force transmitted from the electric motor 10 via the transmission shaft TS. The glass substrate 2 is supplied with a drive force while being supported in a contacting manner at both end portions 2b by the drive rollers 9A and the driven rollers 9B of the drive force application means 4, and is transported in the transporting direction while its intermediate region 2c is contactlessly supported by the filtered air of the air-supplying-type support means 3. At this time, misalignment in a direction intersecting the transporting direction is restricted by the large diameter portions of the drive rollers 9A and the driven rollers 9B.

This structure allows the number of drive mechanisms such as the electric motor 10 to be reduced, and therefore the structure is simplified and the rollers on both sides of the glass substrate 2 can be synchronized easily. Constitution of the drive rotors and the driven rotors by an endless member such as a timing belt is also included in the scope of this invention.

In this embodiment, it is also possible to provide a discharged air amount adjustment means capable of adjusting the amount of air discharged over the air route.

That is, as shown in FIGS. 15A, 15B, and 16, a partitioned air rectifying plate 41 serving as a porous member is constituted by a plurality of plate-shaped portions 41a partitioned in the width direction, and the plate-shaped portions 41a adjacent to one another are positioned in the width direction with a spacing between them, forming the second through holes 16b that allow air to pass into the second circulation path CP2. However, here the configuration is such that due to a discharged air amount adjustment means 40, the amount of air that is discharged over the second circulation path CP2 is adjusted by adjusting the spacing between the plate-shaped work pieces 41a of the partitioned air rectifying plate 41.

That is, the partitioned air rectifying plate 41 is configured partitioned into two elements, these being the plate-shaped portion 41a covering the area above the three fan-filter units 14 located on one side in the width direction and the plate-shaped portion 41a covering the area above the three fan-filter units 14 located on the other side in the width direction. The second through holes 16b are formed between these plate-shaped portions 41a. The plate-shaped portion 41a of the one side in the width direction is constituted by a porous portion 41b in which numerous through holes 16a are formed located above the fan-filter units 14, and a closed portion 41c in which through holes 16a located above the air route are not formed, and that plate-shaped portion 41a is supported on an upper portion of the fan-filter units 14 such that it can slidably move in the width direction. Also, an electric cylinder 42 is provided on the up-stream side lateral wall of the fan-filter unit 14 on the up-stream side, and on the down-stream side lateral wall of the fan-filter unit 14 on the down-stream side, of the three fan-filter units 14, and the tip portions of the cylinders 42 are linked to the plate-shaped portions 41a. Due to the extending and contracting action of the cylinders 42, the plate-shaped portion 41a is slidably moved in the width direction and the closed portion 41c advances and retreats in the width direction above the air route. It should be noted that the other plate-shaped portion 41a has an identical configuration, and thus description thereof is omitted.

That is, the discharged air amount adjustment means 40 includes a total of four of the above-described cylinders 42, and is configured such that the spacing between the plate-shaped portions 41a is adjusted by the coordinated extension and contraction of the cylinders 42. Consequently, as shown in FIG. 15A, the spacing between the plate-shaped portions 41a is reduced by extending the cylinders 42, and due to the reduction in the amount of air that passes through the second through holes 16b, the amount of air that is discharged over the second circulation path CP2 is also reduced. As shown in FIG. 15B, the spacing between the plate-shaped portions 41a is increased by contracting the cylinders 42, and due to the increase in the amount of air that passes through the second through holes 16b, the amount of air that is discharged over the second circulation path CP2 is also increased.

In this embodiment, it is also possible to provide a discharged air amount adjustment means capable of adjusting the amount of air discharged over the air route.

Figure 17:
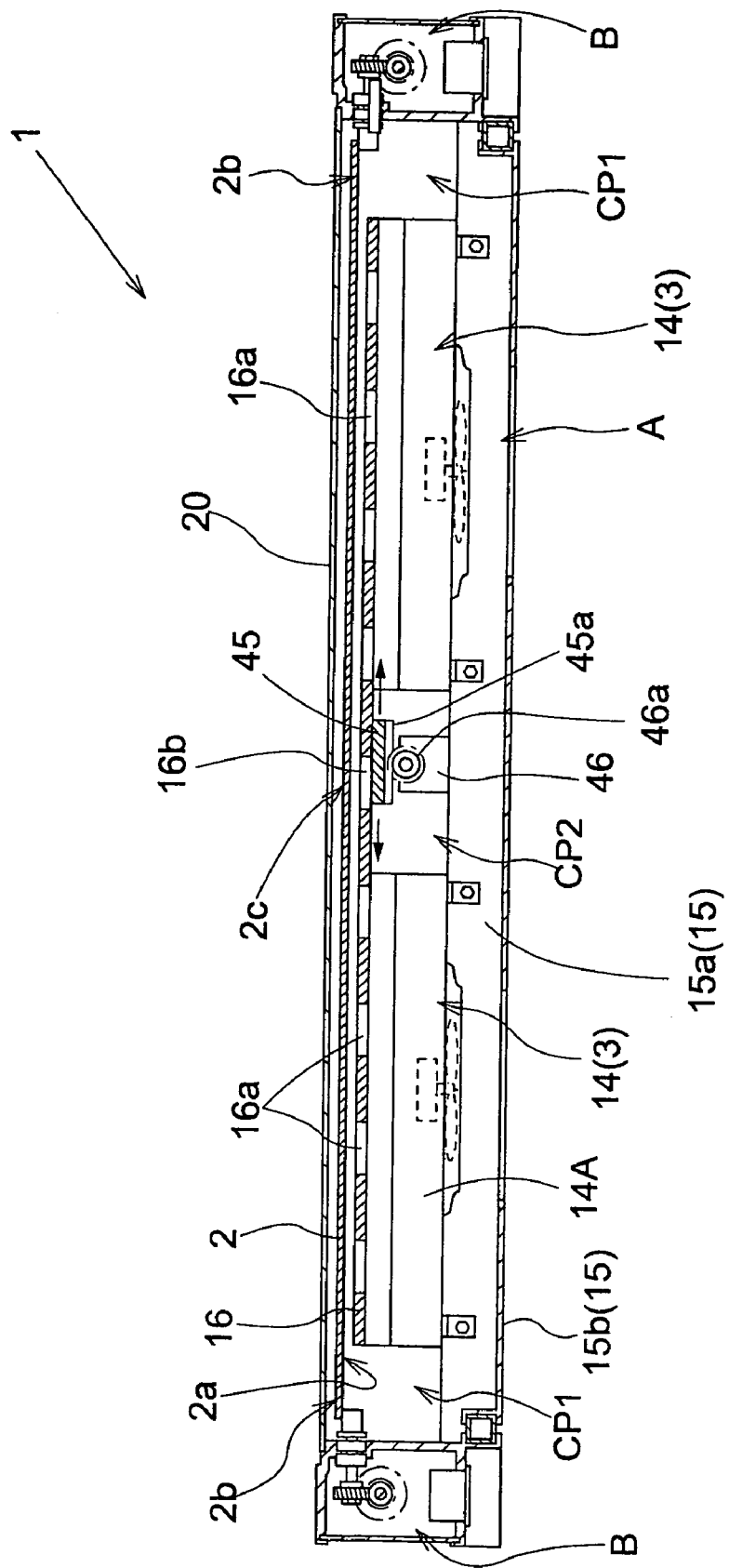
FIG. 17 is a front view of the discharged air amount adjustment means according to a separate embodiment.
Figure 18:
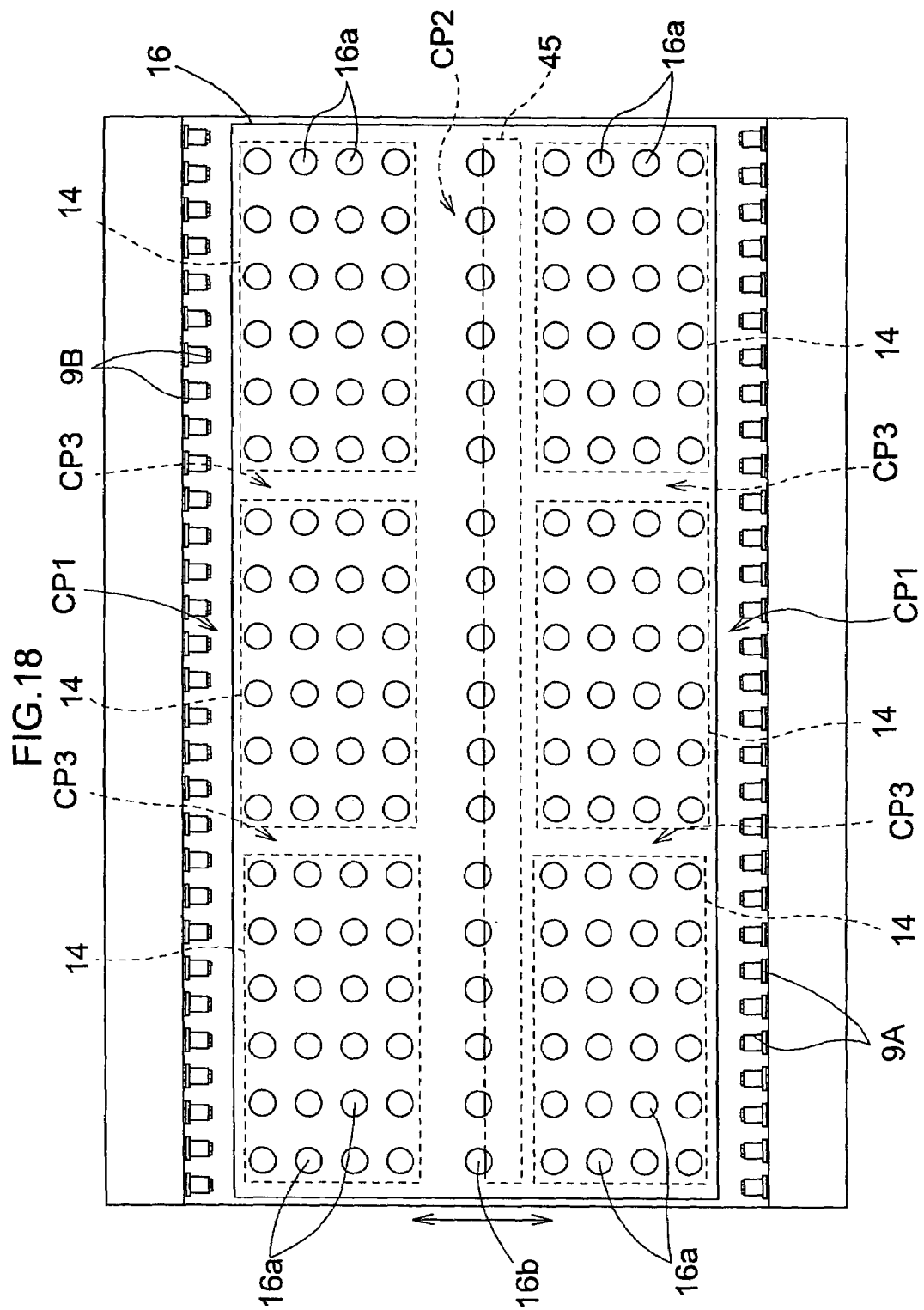
FIG. 18 is a plan view of the discharged air amount adjustment means according to a separate embodiment.

As shown in FIGS. 17 and 18, the discharged air amount adjustment means 40 can be configured provided with an adjustment plate 45 for adjusting the extent of the opening of the second through holes 16b. That is, the discharged air amount adjustment means 40 is configured so that by moving the adjustment plate 45, the extent of the opening of the second through holes 16b is adjusted, adjusting the amount of air that is discharged over the second circulation path CP2.

More specifically, a single adjustment plate 45 is slidably supported in the width direction on the lower surface side of the air rectifying plate 16 configured in the same manner as in the above embodiment, and by slidably moving the adjustment plate 45 in the width direction, each of the plurality of second through holes 16b is partially or completely covered, thereby adjusting the extent of the opening of the second through holes 16b. Further, the electric motor 46 is supported on the support frame 15a so that it is positioned in the second circulation path CP2. A gear portion 46a provided on the output shaft of the motor 46 engages with a gear groove 45a formed in the lower surface of the adjustment plate 45.

That is, the discharged air amount adjustment means 40 is constituted by the adjustment plate and the motor 46, and is configured so that by rotating the motor 46 forward and in reverse to slidably move the adjustment plate 45, the amount of opening of the second through holes 16b can be adjusted, and by adjusting the amount of air that passes through the second through holes 16b, the amount of air that is discharged over the second circulation path CP2 is also adjusted.

Further, in this embodiment the air-supplying units can be configured such that their position can be adjusted in the width direction, and the discharged air amount adjustment means can be configured such that the amount of air that is discharged over the air route is adjusted by changing/adjusting the distance between the air-supplying units lined up in the width direction.

Figure 20:
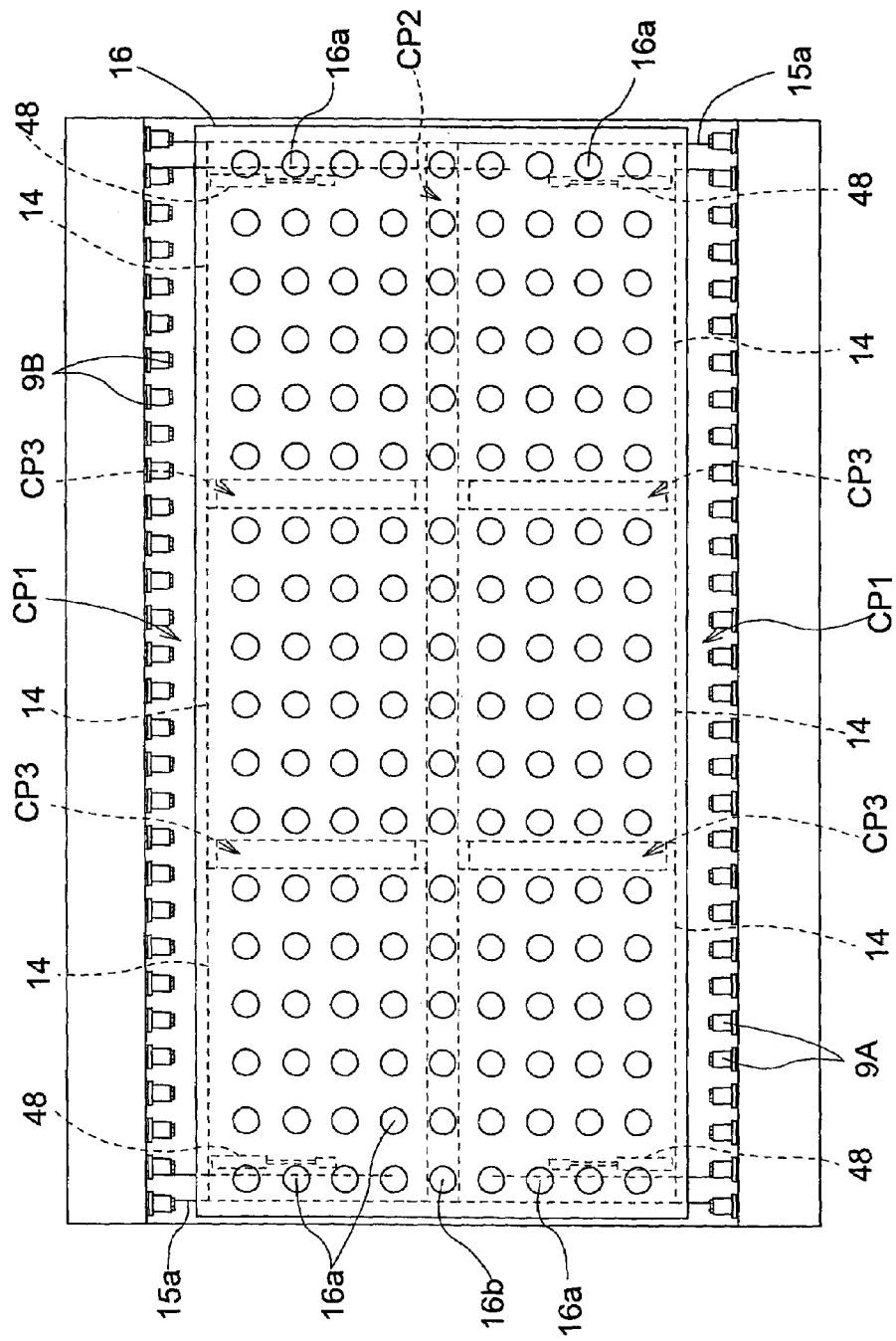
FIG. 20 is a plan view of the discharged air amount adjustment means according to a separate embodiment.

That is, as shown in FIGS. 19A, 19B, and 20, the fan-filter units 14 are supported slidably movable in the width direction with respect to the support frame portion 15a of the unit frame member 15, and the three fan-filter units 14 lined up in the transporting direction are linked by a linking member such that they slidably move in the width direction as a single unit. Further, as shown in FIGS. 19A and 19B, the support frame portion 15a is provided with four electric unit cylinders 48, and the front end portions of the unit cylinders 48 are linked to the bottom portions on the up-stream side of the two fan-filter units 14 on the up-stream side, and to the bottom portions on the down-stream side of the two fan-filter units 14 on the down-stream side. The air rectifying plate 16 is fixedly supported on a fixed portion of the plate-shaped work piece transporting apparatus H such as the unit frame member 15.

That is, the discharged air amount adjustment means 40 includes a total of four cylinders 48, and is configured such that by extending and contracting the cylinders 48 in a coordinated fashion, the spacing between the fan-filter units 14 lined up in the width direction is adjusted. Consequently, as shown in FIG. 19A, the spacing between the fan-filter units 14 lined up in the width direction is reduced by extending the unit cylinders 48, reducing the amount of air that is discharged over the second circulation path CP2. As shown in FIG. 19B, the spacing between the fan-filter units 14 lined up in the width direction is widened by shortening the unit cylinders 48, increasing the amount of air that is discharged over the second circulation path CP2. Also, by extending and contracting the unit cylinders 48 the fan-filter units 14 are moved in the width direction with respect to the air rectifying plate 16, and when the unit cylinders 48 are extended, some of the second through holes 16b are closed by the fan-filter units 14 and this reduces the amount of air that passes through the second through holes 16b. In this manner the amount of air that passes through the second through holes 16b is also adjusted by moving the fan-filter units 14.

It should be noted that the pressure of the air supplied to the lower surface of the plate-shaped work piece can be altered where necessary to correspond to the air force of the air-supplying-type support means or the plate-shaped work piece that is supported.

Figure 21:
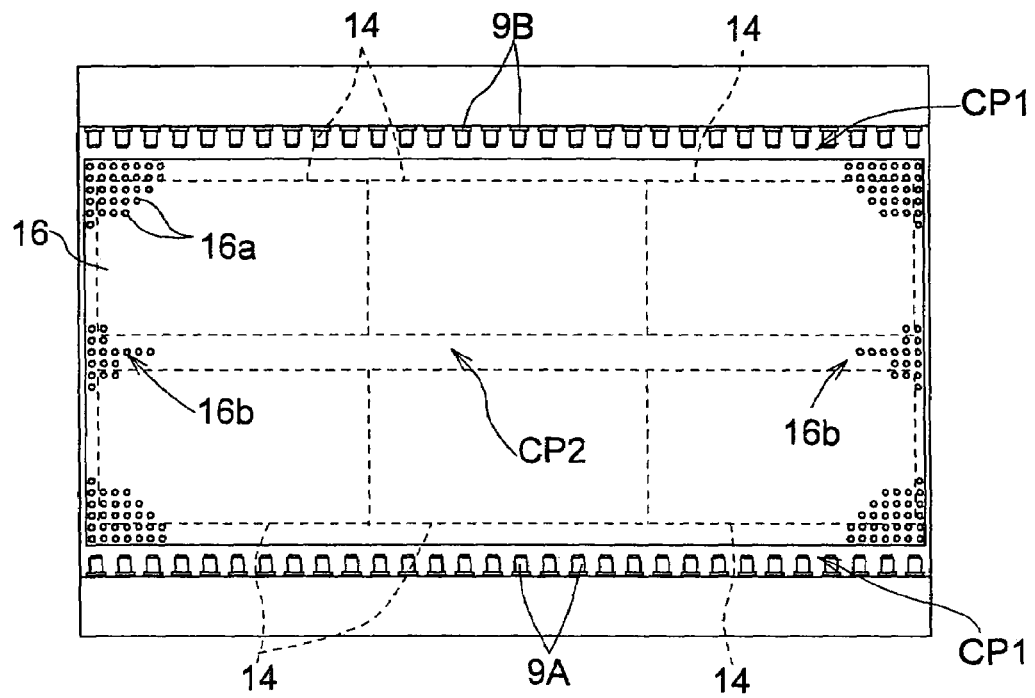
FIG. 21 is a plan view showing the transporting unit according to a separate embodiment.

In this embodiment, both a second circulation path formed by separating the air-supplying units lined up in the width direction and a third circulation path formed by separating the air-supplying units lined up in the transporting direction are provided, but it is also possible to adopt a configuration in which only one of these is provided. That is, as shown in FIG. 21, it is also possible to adopt a configuration in which the fan-filter units 14 lined up in the width direction are separated to provide the second circulation path CP2 and the air-supplying units lined up in the transporting direction are brought closer to one another to not provide the third circulation path CP3.

Figure 22:
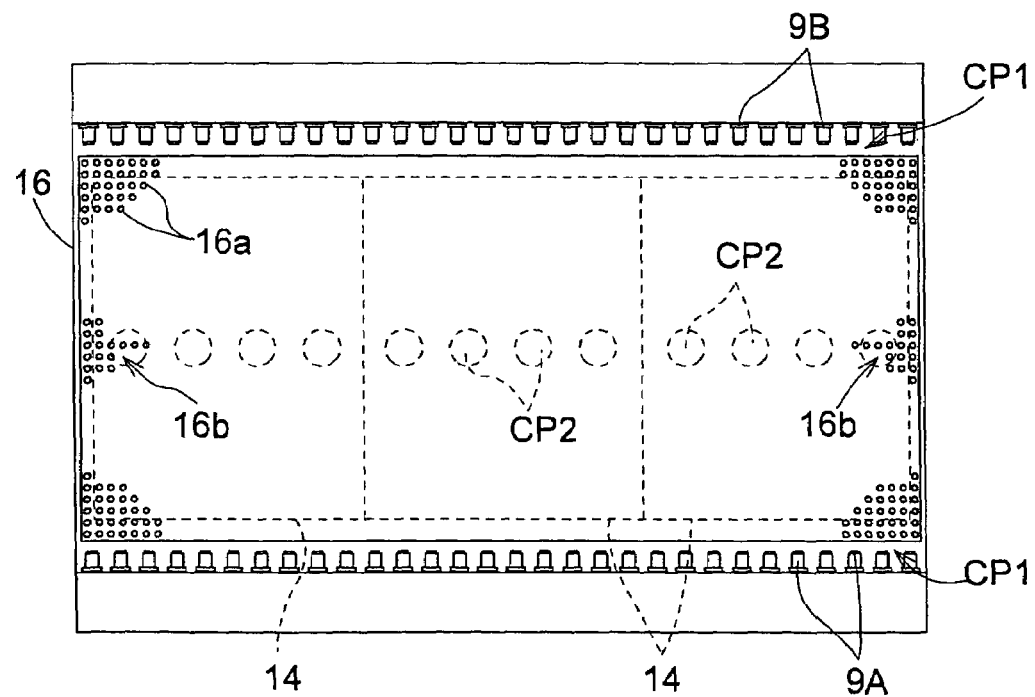
FIG. 22 is a plan view showing the transporting unit according to yet another embodiment.

Further, as shown in FIG. 22, it is also possible to adopt a configuration in which the second circulation path CP2 is formed at a position between two air-supplying means in the fan-filter units serving as air-supplying units so as to form a circulation path at an intermediate position in the width direction of the air-supplying-type support means.

THIRD EMBODIMENT

Figure 23:
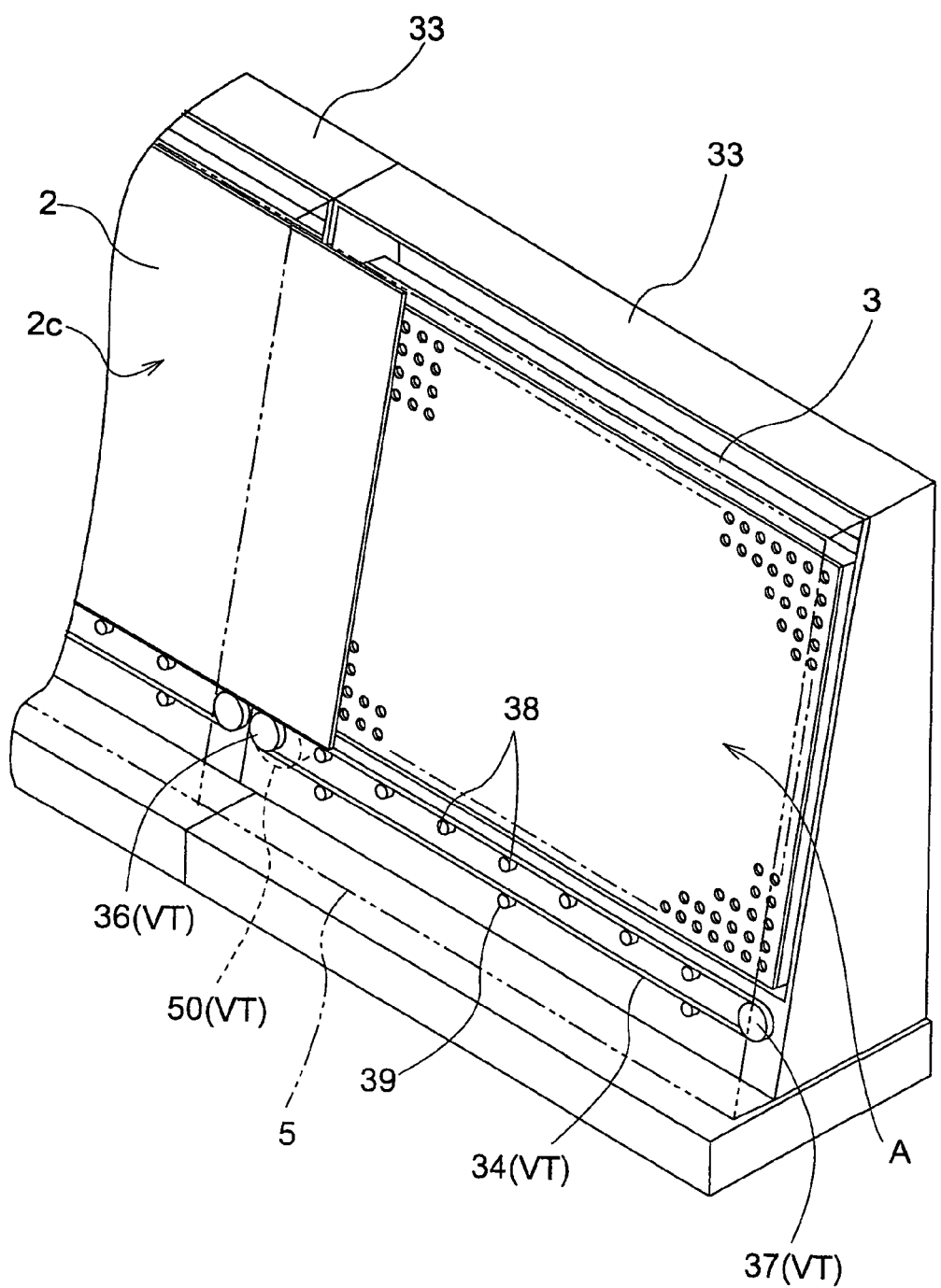
FIG. 23 is a perspective view in which a portion of the transporting apparatus according to the third embodiment has been omitted.
Figure 24:
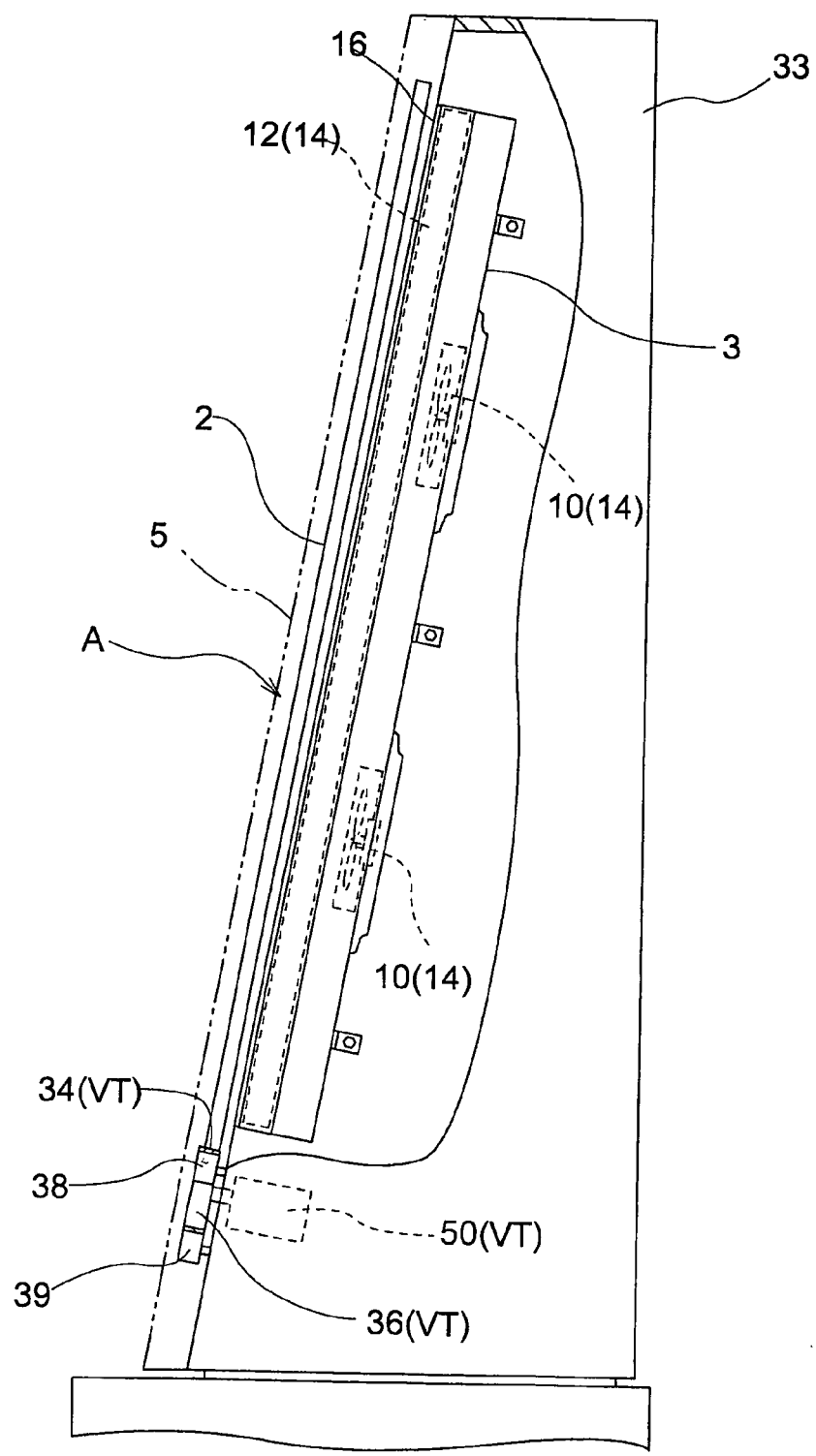
FIG. 24 is a partially notched lateral sectional view of the transporting apparatus according to the third embodiment.

FIG. 23 and FIG. 24 show a separate embodiment of the orientation of the transported object, and hereinafter description is made with reference to the drawings, focusing on differences with the other embodiments. Components corresponding to those of the above embodiments are assigned identical reference numerals and detailed description thereof is omitted.

As shown in FIGS. 23 and 24, a plurality of vertical orientation transporting units 33 are provided lined up in the transporting direction of the glass substrate 2, and transport the glass substrate 2, which serves as the transported object, in a nearly vertical orientation.

Further, the vertical orientation transporting units 33 each are constituted by providing a vertical orientation air-supplying-type support means 3 provided in a nearly vertical orientation and a vertical orientation drive force application means VT.

Incidentally, in this embodiment the glass substrate 2 is transported in a nearly vertical orientation, and thus the side on which the vertical orientation transporting units 33 are present is the lower surface portion of the glass substrate 2.

The vertical orientation air-supplying-type support means 3 is configured such that filtered air is supplied toward the lower surface portion of the glass substrate 2 being transported in a nearly vertical orientation so as to contactlessly support the glass substrate 2.

Incidentally, the vertical orientation air-supplying-type support means 3, like the air-supplying-type support means 3 in the embodiment, is constituted by a fan-filter unit 14 in which a dust-removal filter 12 and the blowing fan 13 are incorporated into a single unit, and as for the fan-filter unit 14, two blowing fans 13 lined up vertically and one dust-removal filter 12 are incorporated into a single unit.

An air rectifying plate 16 for rectifying filtered air from the fan-filter unit 14 is also provided.

The vertical orientation drive force application means VT is provided with a timing belt 34 that applies a drive force while supporting the end portions of the glass substrate 2 in a contacting manner, and thus applies a drive force in the transporting direction to the glass substrate 2. To describe the vertical orientation drive force application means VT in further detail, it is provided with a drive shaft 36 that is positioned on the down-stream side and rotates due to an electric motor 50, a driven shaft 37 that is positioned on the up-stream side and is capable of rotation, and the timing belt 34, which is wound between the drive shaft 36 and the driven shaft 37.

The timing belt 34 is supported on its forward route portion by inner support shafts 38 from its inner circumferential side, and is supported on its return route portion by outer support shafts 39 from its outer circumferential side.

A transport casing 5 that covers the transport space A, which accommodates the vertical orientation air-supplying-type support means 3 and the transport route of the glass substrate 2, in an airtight or substantially airtight manner is provided.

The blowing fans 13, like in the above embodiments, are configured such that they can freely change between a plurality of air supply amount levels, these being a support air supply amount, a set air supply amount that is smaller than the support air supply amount, and a set air supply amount that is larger than the support air supply amount.

Further, the control member H is configured such that, in accordance with a command from an operation command switch S, it controls the starting and stopping of operation of the electric motor 50 and the state of operation of the fan-filter units 14 for each of the plurality of transporting units 1.

Incidentally, since a sub-fan-filter unit is not provided in this embodiment, the control block diagram is that shown in FIG. 8 with the sub-fan-filter unit 23 omitted and the electric motor 10 changed to the electric motor 50.

Also, the control potion H is configured such that, in accordance with a command from the operation command switch S, the blowing fans 13 in the fan-filter unit 14 are operated at any one of the support air supply amount, the small setting air supply amount, and the large air supply amount.

In the above embodiment is it also possible to use a transport casing 5 that opens the upper area of the transport space A instead of a transport casing 5 that covers the transport space A.

FOURTH EMBODIMENT

A case in which the air-supplying-type support means of the plate-shaped work piece transporting apparatus is provided with a ventilation route for distributively supplying the air blown by the air-supplying means to a plurality of dust-removal filters is described below with reference to the drawings. In this embodiment, the glass substrate is transported in a horizontal or substantially horizontal orientation.

It should be noted that features identical to those of the first embodiment are assigned the same reference numerals as in the first embodiment and description thereof is omitted.

Figure 27:
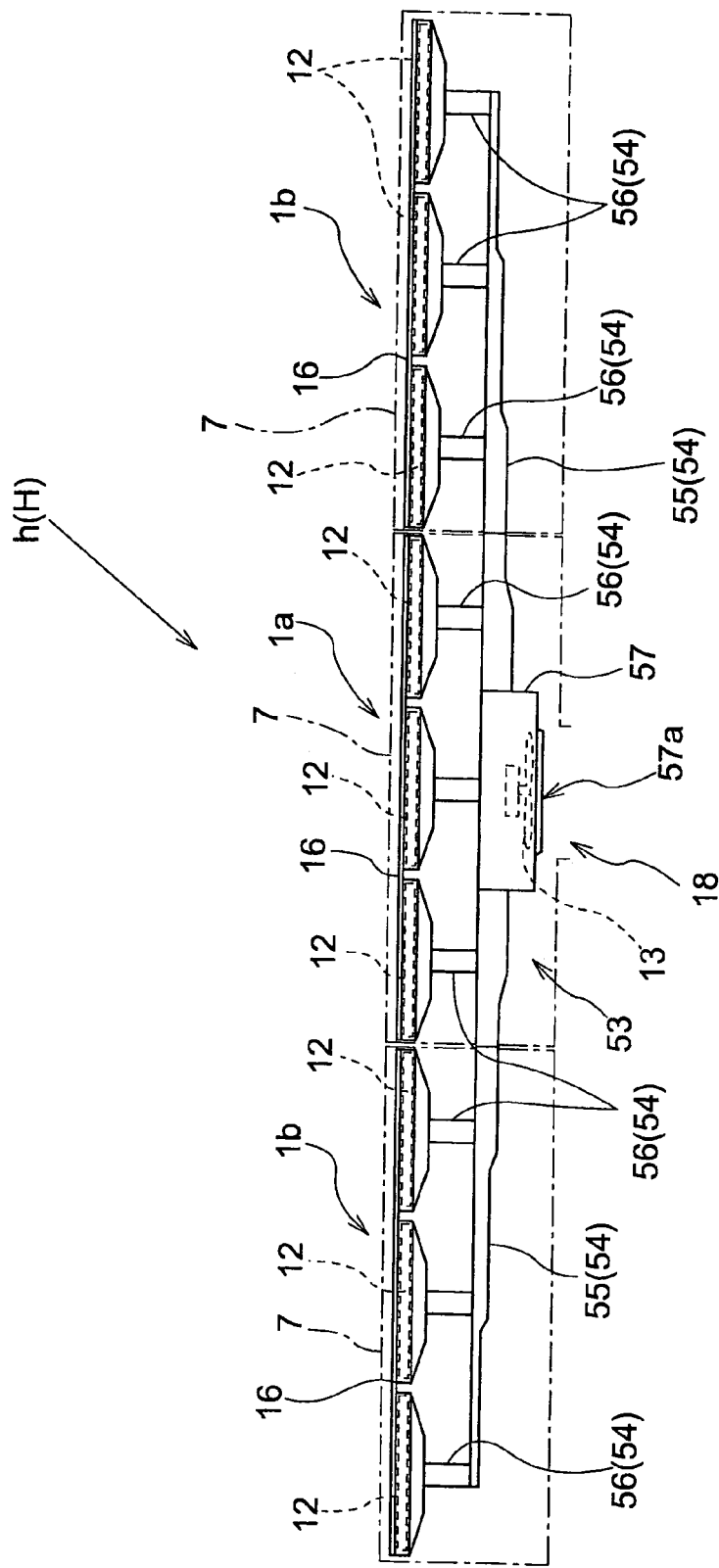
FIG. 27 is a lateral view of the plate-shaped work piece transporting mechanism of a fourth embodiment.

The plate-shaped work piece transporting apparatus H is an apparatus such as that shown in FIG. 27, which uses plate-shaped work piece transporting mechanisms h lined up in the transporting direction of the glass substrate 2, and the plate-shaped work piece transporting mechanisms h are provided with an air-supplying-type support mechanism 53, serving as the air-supplying-type support means, that contactlessly support the glass substrate 2 by supplying filtered air toward the lower surface 2a of the glass substrate 2 that is transported.

Figure 28:
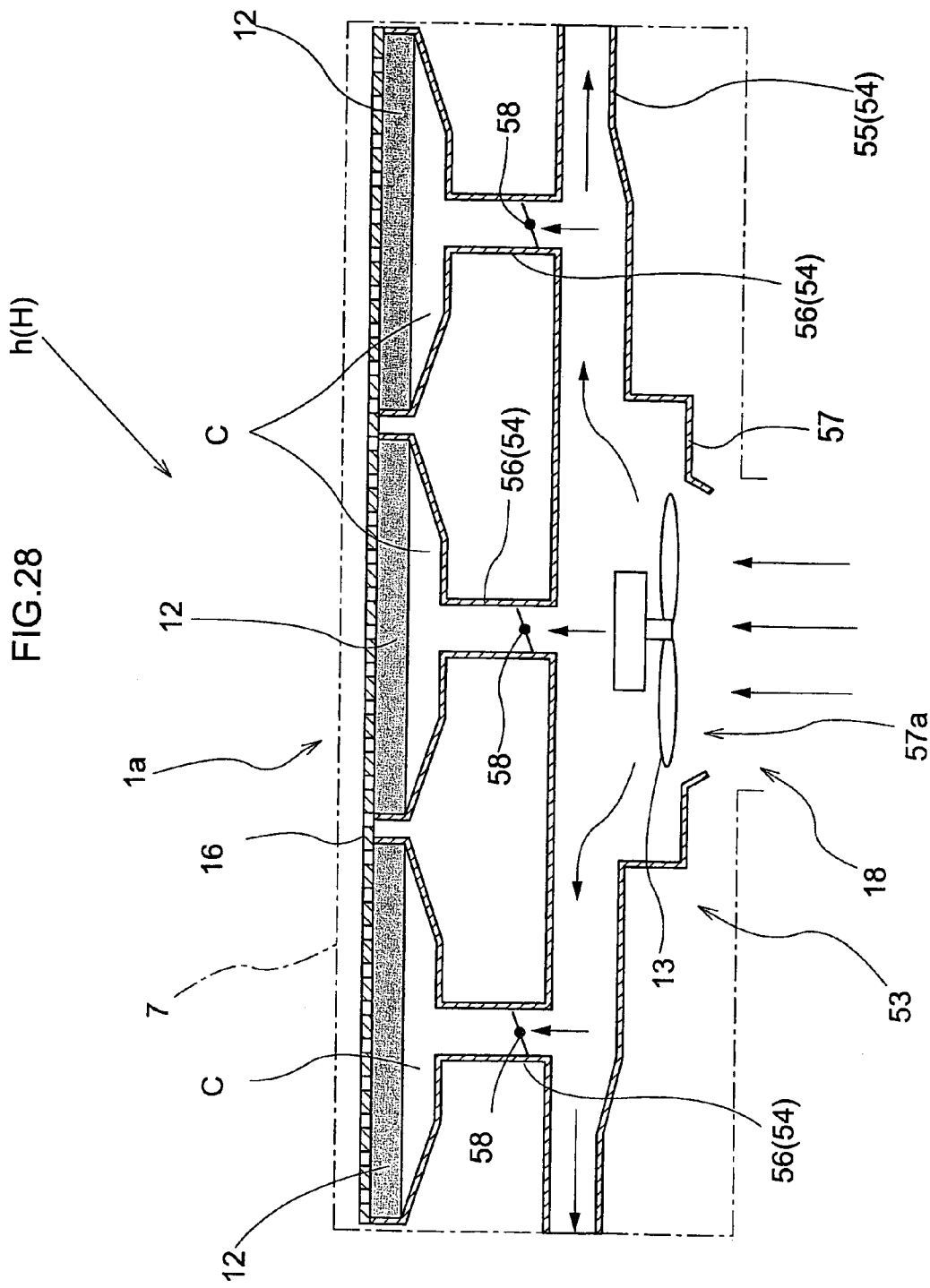
FIG. 28 is a lateral view of the main plate-shaped work piece transporting unit of the fourth embodiment.
Figure 29:
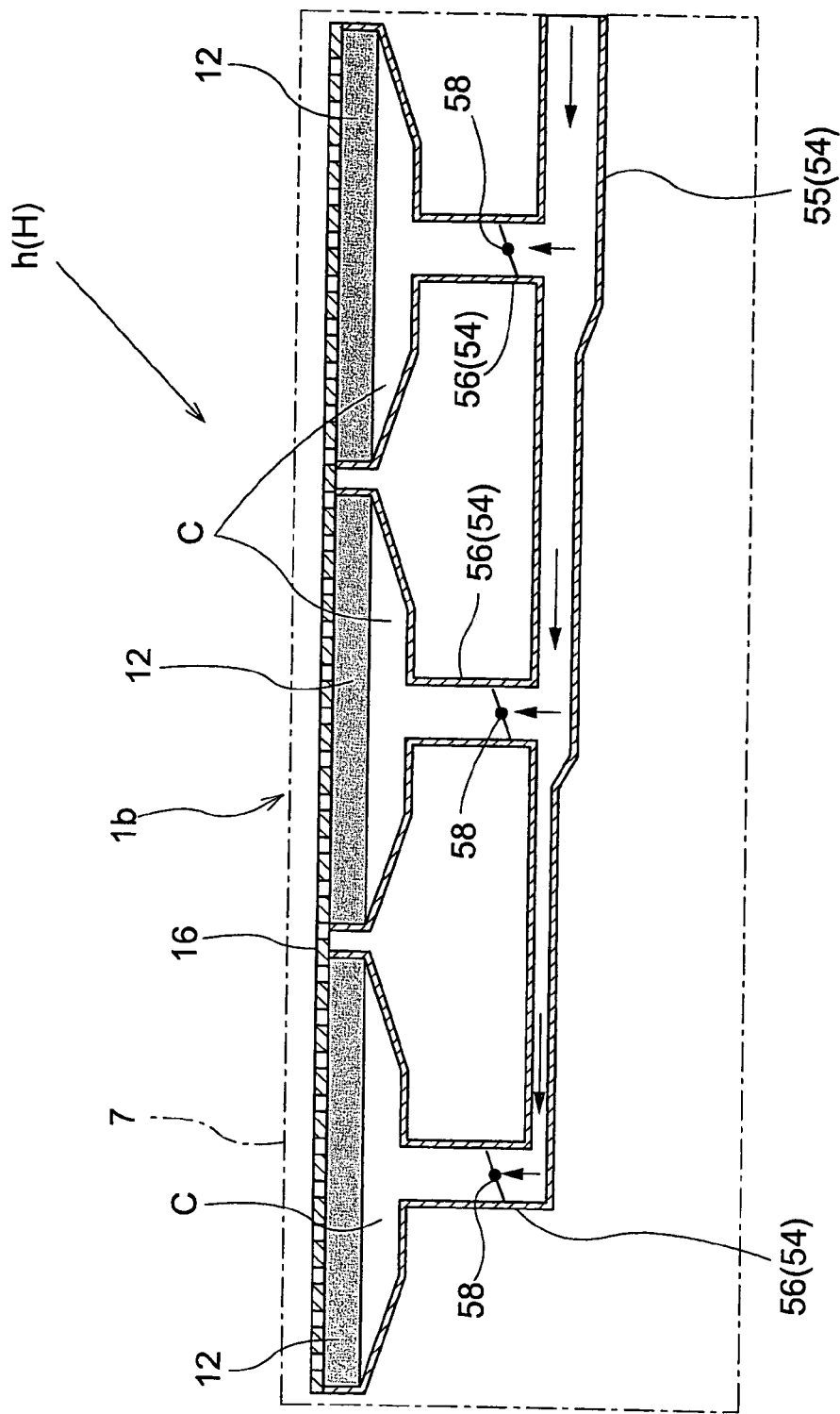
FIG. 29 is a lateral view of a secondary plate-shaped work piece transporting unit of the fourth embodiment.

The air-supplying-type support mechanism 53 is constituted by providing nine dust-removal filters 12 including ULPA filters for removing dust, a blowing fan 13 for supplying filtered air toward the lower surface 2a of the glass substrate 2 via the dust-removal filters 12, and a ventilation route 54 for distributively supplying the air from the blowing fan 13 to the plurality of dust-removal filters 12. Also, as shown in FIGS. 28 and 29, plate-shaped air rectifying plates 16 for circulating the filtered air that has passed through the dust-removal filters 12 are provided in such a manner that they cover the upper area of three of the dust-removal filters 12.

Further, as shown in FIG. 27, the ventilation route 54 is formed by solid ducts and includes horizontal ventilation routes 55 that guide air from the blowing fan 13 in the horizontal direction, which is along the transporting direction, and vertical ventilation routes 56 that guide air from the blowing fan 13 in the vertical direction.

The horizontal ventilation routes 55 are connected to the lateral walls of a fan case 57 accommodating the blowing fan 13, and two horizontal ventilation routes 55 are provided, these being the horizontal ventilation route 55 extending toward the up-stream side from the fan case 57 and the horizontal ventilation route 55 extending toward the down-stream side from the fan case 57. Nine vertical ventilation routes 56 are provided in order to respectively connect to the nine dust-removal filters 12.

The four vertical ventilation routes 56 connected to the four dust-removal filters 12 positioned on the upper side in the transporting direction are each connected to the horizontal ventilation route 55 extending toward the up-stream side. Likewise, the four vertical ventilation routes 56 connected to the four dust-removal filters 12 positioned on the lower side in the transporting direction are each connected to the horizontal ventilation route 55 extending toward the down-stream side. Furthermore, the single vertical ventilation route 56 connected to the dust-removal filter 12 positioned in the middle in the transporting direction is connected to the ceiling wall of the fan case 57.

It should be noted that an introduction hole 57a for introducing the air within the transport space A into the fan case 57 is formed in the bottom wall of the fan case 57.

As shown in FIG. 28 and FIG. 29, both vertical ventilation routes 56 are provided with an air amount adjustment valve 58 capable of swinging about a horizontal axis, such that by swinging the air amount adjustment valves 58 it is possible to adjust the amount of air that is supplied toward the dust-removal filters 12. Further, chamber rooms C in which air from the blowing fan 13 collects are formed in the upper end portion of the vertical ventilation routes 56, that is, the portion that connects to the inner wall portion of the dust-removal filters, so that even if pulsation occurs in the air supplied from the blowing fan 13, pulsation due to the cushion effect caused by the increase and decrease of air pressure within the chamber rooms C can be inhibited.

The plate-shaped work piece transporting mechanisms h have three units, that is, a single main transporting unit 1a provided with a main portion 53a such as that shown in FIG. 28, and two secondary transporting units 1b provided with a secondary portion 53b such as that shown in FIG. 29. It should be noted that both the main transporting unit 1a and the secondary transporting units 1b are provided with a drive force application means 4 and a case member 7, and since these have the same configuration as in the first embodiment, they will not be described in detail.

Consequently, the horizontal ventilation route 55 of the main portion 53a and the horizontal ventilation route 55 of the secondary portions 53b are connected on the up-stream side and the down-stream side of the main transporting unit 1a, and by connecting the secondary plate-shaped work piece transporting units 1b, the plate-shaped work piece transporting mechanisms h are assembled.

It should be noted that the plate-shaped work piece transporting mechanisms h can also be constituted by a single main transporting unit 1a, or can be constituted by two units, the main transporting unit 1a and a secondary transporting unit 1b connected to one side of the main transporting unit 1a in the transporting direction. In this case, the end portion of the horizontal ventilation route 55 to which the secondary transporting unit 1b is not connected of the main transporting unit 1a is closed off.

Further, as regards the manner in which plate-shaped work pieces are supported by the air-supplying-type support mechanism 53, the blowing action of the blowing fan 13 causes air within the transport section A below the blowing fan 13 to be sucked in and carried into the fan case 57 from the introduction hole 57a, and the air thus carried passes over the ventilation route 54 and is sent toward the dust-removal filter 12, passes through the dust-removal filters 12 and the air rectifying plates 16, and is supplied onto the intermediate region 2c of the lower surface 2a of the glass substrate 2 as filtered air, supporting the intermediate region 2c of the glass substrate 2 by the filtered air.

In the main transporting unit 1a, the blowing action of the blowing fan 13 sends air through the ventilation route 54, the dust-removal filters 12, and the air rectifying plates 16 and supplies it to the lower surface 2a of the plate-shaped work piece 2, circulating the air within the main transporting unit 1a. Also, the blowing action of the blowing fan 13 introduces outside air into the transport space A from the air introduction opening 18, and due to the increase in pressure within the transport space A, some of the air circulating within the transport space A is discharged outside through the air discharge opening 17 or the gap between the accommodation frame 8 and the transport cover 20, for example, exchanging some of the air circulating within the transport space A.

With the secondary transporting units 1b, the blowing action of the blowing fan 13 sends air through the ventilation route 54 from the main transporting unit 1a side and introduces it toward the secondary transporting units 1b. The air that has been thus introduced is passed through the ventilation route 54, the dust-removal filters 12, and the air rectifying plates 16 and supplied onto the lower surface 2a of the plate-shaped work piece 2. Due to the introduction of air from the main transporting unit 1a side, the pressure within the transport space A of the secondary transporting units 1b is increased, and this discharges some of the air within the transport space A to the outside through the air discharge opening 17 or the gap between the accommodation frame 8 and the transport cover 20, for example, exchanging some of the air within the transport space A.

Thus, pressure is increased within the transport space A of the main transporting unit 1a and the secondary transporting units 1b by introducing air, and therefore the infiltration of outside air through the air discharge opening 17 or the gap between the accommodation frame 8 and the transport cover 20, for example, can be prevented. Also, since outside air is introduced into the transport space A, the temperature within the transport space can be kept at or near the outside temperature.

FURTHER EMBODIMENTS (1) In the above embodiments it is also possible to adopt a configuration in which the air-supplying units are provided with a blocking portion that allows filtered air to flow through the through holes of the porous member and conceals-the through holes in the direction in which the filtered air flows.

Figure 25:
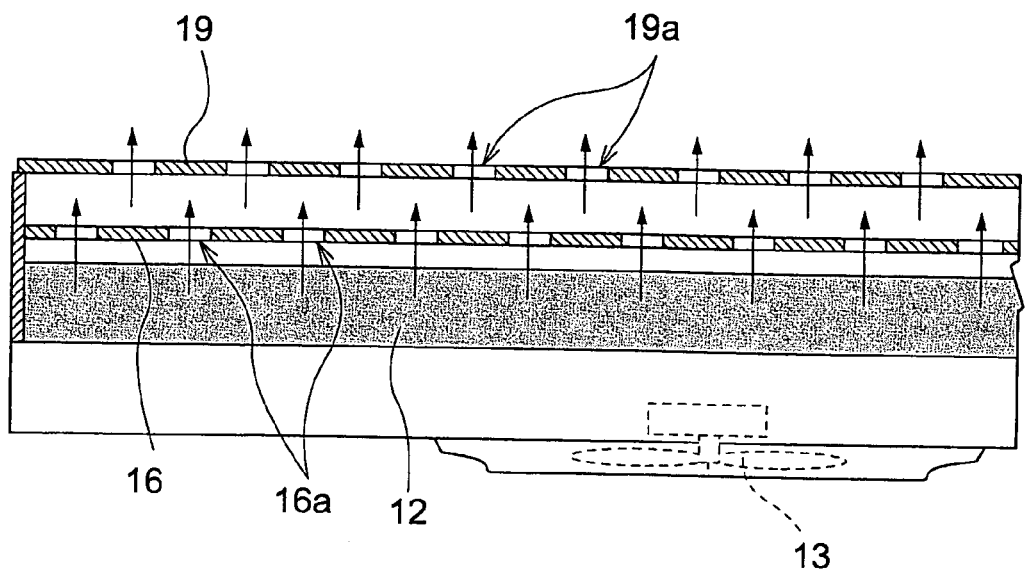
FIG. 25 is a partial magnified lateral sectional view of the air-supplying unit according to a separate embodiment.
Figure 26:
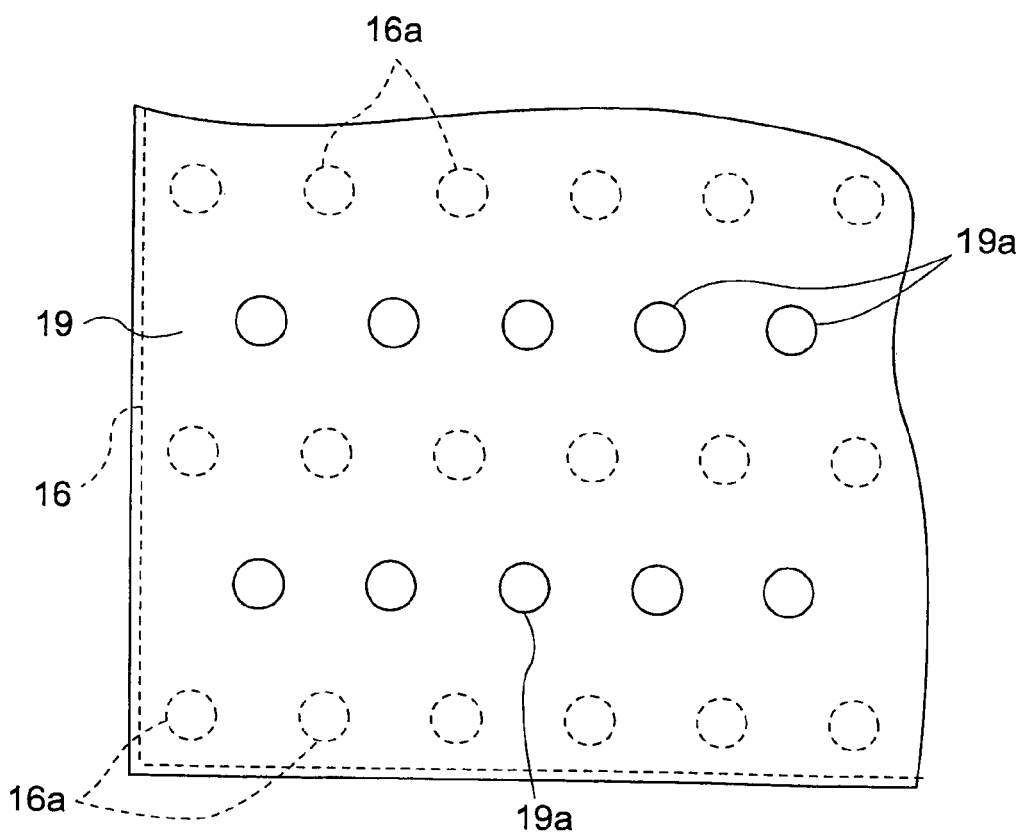
FIG. 26 is a partial magnified plan view of the air-supplying unit according to a separate embodiment.

That is, as shown in FIGS. 25 and 26, a blocking plate 19 serving as a blocking portion is further provided above the air rectifying plate 16 in the air-supplying units 14, and through holes 19a are formed in the blocking plate 19 by punching at locations that do not overlap with the through holes 16a of the air rectifying plate 16 in the direction in which the filtered air flows.

It is also possible to invert the positional relationship between the air rectifying plate and the blocking plate. Furthermore, instead of having a blocking plate serve as the blocking portion and providing the air rectifying plate and the blocking plate separately, it is also possible to adopt a configuration in which the blocking portion is integrally formed in the air rectifying plate, by for example providing a flap, on the upper surface or the lower surface of the circumferential portion of the through holes of the air rectifying plate, as a blocking portion that allows filtered air to flow through the through holes of the air rectifying plate and conceals the through holes in the direction in which the filtered air flows.

(2) In the fourth embodiment, the ventilation route is constituted by a hard duct, but it is also possible for some or all of the ventilation route to be constituted by soft hose, for example. Further, the air amount adjustment valve is made swingable about a horizontal axis and can adjust the amount of air that is supplied toward the dust-removal filters, but it is also possible for the air amount adjustment valve to be capable of sliding movement back and forth in the ventilation route so as to adjust the amount of air that is supplied toward the dust-removal filters.

Figure 30:
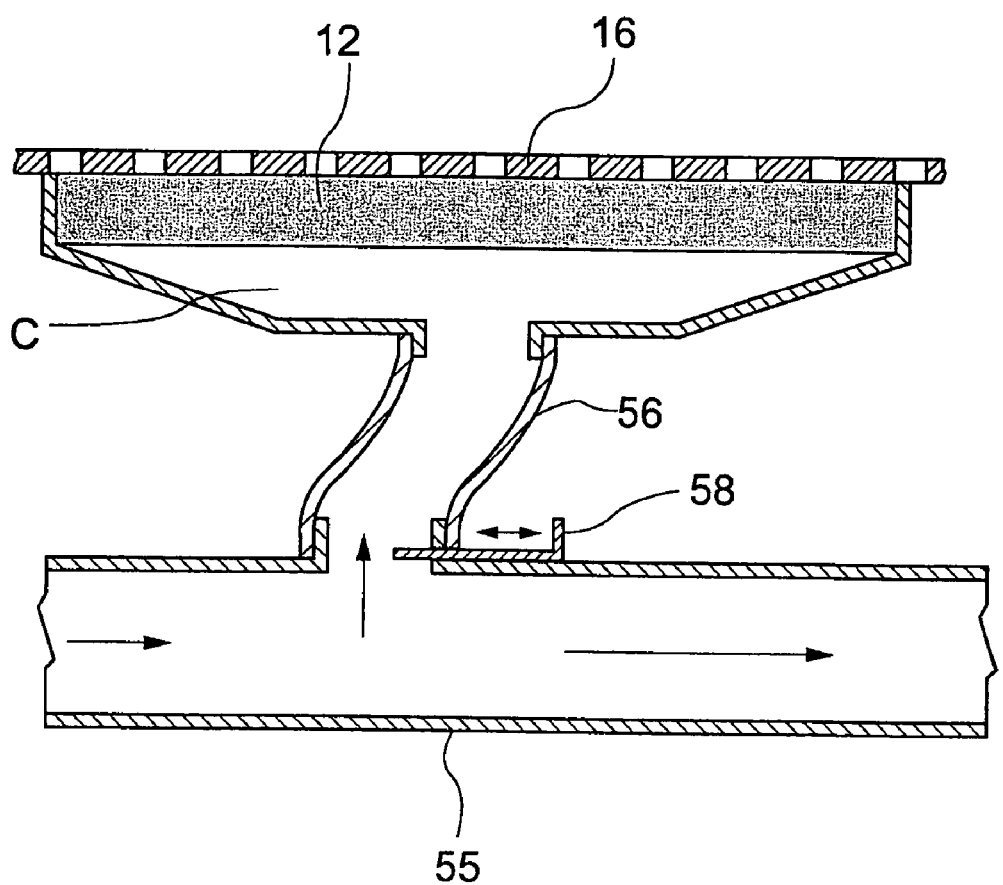
FIG. 30 is a lateral view of the main plate-shaped work piece transporting unit according to a separate embodiment.

That is, as shown in FIG. 30, it is also possible to adopt a configuration in which the vertical ventilation routes 56 in the ventilation route 54 include hose, and an air amount adjustment valve 58 capable of sliding over the horizontal ventilation route 55 so as to adjust the extent of the opening that is formed in order to link the horizontal ventilation routes 55 and the vertical ventilation routes 56 is provided, and by adjusting the amount that the air amount adjustment valve 58 is moved forward and backward with respect to the air route, the amount of air that is supplied toward the dust-removal filters can be adjusted.

(3) In the above embodiments the air-supplying-type support means is constituted by a plurality of air-supplying units in which dust-removal filters and air-supplying means are incorporated into a single unit, but as in the fourth embodiment, it is also possible to provide a ventilation route for guiding air supplied by the air-supplying means to the dust-removal filters, for example, and for the air-supplying-type support means to be made of the dust-removal filters 12 and blowing fans 13 individually incorporated as separate units.

(4) In the first embodiment and the second embodiment, the transport casing is provided in two upper and lower levels and transporting portions are provided in two upper and lower levels accommodated in the respective transport casings, but it is also possible to accommodate the upper and lower level transporting portions in a single accommodation case. In this case, it is possible to adopt a configuration in which the accommodation case is partitioned in two into upper and lower partitions, and by rocking the upper portion of the transport casing upward about one of its end sides, the upper transport casing and the upper transporting portion together swing upward. It is also possible to accommodate a single transporting portion in a single transport casing and make the transporting portion a single level.

(5) In the first embodiment and the second embodiment, the drive force application means for applying a drive force in the transporting direction to the plate-shaped work piece is provided with a drive rotor for applying a drive force while supporting both end portions of the plate-shaped work piece in a contacting manner, and the air-supplying-type support means is configured such that it supports a portion located between the end portions of the plate-shaped work piece, but it is also possible for the glass substrate to be contactlessly supported by the air-supplying-type support means only.

(6) In the first embodiment and the second embodiment, both end portions of the plate-shaped work piece are supported in a contacting manner by the drive rotor of the drive force application means, and by rotatively driving the drive rotor for contact supporting so as to apply a drive force to the plate-shaped work piece, the plate-shaped work piece is transported in the transporting direction, but it is also possible to adopt a configuration in which both end portions of the plate-shaped work piece are supported by a freely rotating rotator, or that, as discussed above, are contactlessly supported by the air-supplying-type support means only, and without providing a drive force application means, the force of the plate-shaped work piece being automatically or manually transferred to the plate-shaped work piece transporting apparatus positioned on the up-stream side is utilized to push the forerunning plate-shaped work piece and thereby apply a drive force in the transporting direction to the forerunning plate-shaped work piece. It is also possible to adopt a configuration in which drive force in the transporting direction is applied to the plate-shaped work piece by the filtered air supplied by the air-supplying-type support means. Furthermore, it is also possible to gradually lower the plate-shaped work piece in the transporting direction so as to apply a drive force due to the plate-shaped work piece's own weight.

(7) In the third embodiment, an end portion of the plate-shaped work piece is supported in a contacting manner by the drive rotor of the vertical orientation drive force application means, and by rotatively driving the drive rotor for contacting support so as to apply a drive force to the plate-shaped work piece, the plate-shaped work piece is transported in the transporting direction, but it is also possible to adopt a configuration in which one end portion of the plate-shaped work piece is supported by a freely rotating rotor, and without providing the vertical orientation drive force application means, the force of the plate-shaped work piece being automatically or manually transferred to the plate-shaped work piece transporting apparatus positioned on the up-stream side is utilized to push the forerunning plate-shaped work piece and thereby apply a drive force in the transporting direction to the forerunning plate-shaped work piece, and it is also possible to set the transporting direction of the plate-shaped work piece to a tilted direction so as to apply a drive force due to the plate-shaped work piece's own weight.

(8) In the first embodiment and the second embodiment, it is also possible for the drive rotor for applying drive force while supporting both ends of the plate-shaped work piece in a contacting manner to be constituted by an endless belt-shaped member such as a timing belt, and in the third embodiment, it is also possible for the drive rotor for applying drive force while supporting one end of the plate-shaped work piece in a contacting manner to be constituted by a driving roller. In the third embodiment it is also possible to provide a sub-drive force application means for supporting the other end portion with respect to the one end portion of the plate-shaped work piece in a contacting manner with the driving roller or the endless belt-shaped member while applying a drive force.

(9) In the third embodiment, the plate-shaped work piece is transported orientated at a near vertical orientation, but it is also possible to supply filtered air onto an intermediate portion of both surfaces of the plate-shaped work piece so as to transport the plate-shaped work piece at a vertical orientation.

(10) In the above embodiments, the transport casings are provided with an air discharge portion and an air introduction portion and the transport space is substantially airtight, but it is also possible to make the transport space airtight without providing an air discharge portion and an air introduction portion.

(11) In the above embodiments, the dust-removal filters are ULPA filters, but they may also be other filters, such as HEPA (High Efficiency Particulate Air) filters.

(12) In the first and second embodiments, it is also possible to not use the transporting cover 20 and adopt a configuration in which the upper area of the transport space A is open.

(13) The plate-shaped work piece was described as a glass substrate, but it may also be a semiconductor wafer, for example, and there are no particular limitations in the embodiments as to the shape or size of the supported member.

(14) In the first embodiment, adjustment of the air amount may also be carried out such that different air amounts are provided depending on the transporting conditions, even with the object being to transport in a contactless manner.

What is claimed is:

1. An apparatus for transporting plate-shaped work pieces, comprising:
    a frame; and
    an air-supplying support means, which is supported on the frame and which supplies filtered air toward a lower surface of a plate-shaped work piece being transported so as to contactlessly support the plate-shaped work piece, wherein the air-supplying support means has a dust-removal filter for removing dust, a porous member located close to and above the dust-removal filter, and an air-supplying means having an electric fan for supplying filtered air toward the lower surface of the plate-shaped work piece through the dust-removal filter.

2. The apparatus for transporting plate-shaped work pieces according to claim 1, further comprising:
    a drive force application means for applying a drive force in a transporting direction to the plate-shaped work piece;
    wherein the drive force application means is provided with a drive rotor that contacts both end portions in a width direction, which is perpendicular to the transporting direction, of the plate-shaped work piece and applies a drive force thereto; and
    wherein the air-supplying support means supports a portion located between the end portions of the plate-shaped work piece.

3. The apparatus for transporting plate-shaped work pieces according to claim 1, wherein the dust-removal filter and the air-supplying means are incorporated into a single unit, forming an air-supplying unit, and the air-supplying support means is formed by lining up a plurality of such air-supplying units in the transporting direction of the plate-shaped work piece.

4. The apparatus for transporting plate-shaped work pieces according to claim 1, wherein the air-supplying support means is provided with a plurality of dust-removal filters lined up in the transporting direction, and ventilation routes for distributively supplying air from the air-supplying means to the plurality of dust-removal filters.

5. The apparatus for transporting plate-shaped work pieces according to claim 1, further comprising:
    a transport casing covering a transport space in which the air-supplying support means and a transporting route for the plate-shaped work piece are accommodated;
    wherein the air-supplying means sucks in air within the transport casing and supplies the sucked-in air through the dust-removal filter and toward the lower surface of the plate-shaped work piece as filtered air, circulating the air within the transport space.

6. The apparatus for transporting plate-shaped work pieces according to claim 5, wherein the transport casing is provided with an air discharge portion for discharging some of the air within the transport space and an air introduction portion for introducing outside air into the transport space.

7. The apparatus for transporting plate-shaped work pieces according to claim 6, further comprising: an outside discharge means for removing dust from air discharged from the air discharge portion and discharging the air to the outside.

8. The apparatus for transporting plate-shaped work pieces according to claim 7, further comprising: an accommodation case covering, in a substantially airtight manner, an accommodation space accommodating drive means for the drive rotor in the drive force application means, the accommodation case being adjacent to the lateral side of the transport casing; wherein the air discharge portion of the transport casing discharges air within the transport space into the accommodation space; and wherein the outside discharge means sucks in air within the accommodation space, filters that air, and discharges it to the outside.

9. The apparatus for transporting plate-shaped work pieces according to claim 1, wherein the air-supplying support means is provided with the porous member which passes filtered air that has passed through the dust-removal filter, and a blocking portion that allows filtered air to flow through holes of the porous member and conceals the through holes in the direction in which the filtered air flows.

10. The apparatus for transporting plate-shaped work pieces according to claim 1, wherein the frame, the dust-removal filter and the air-supplying means having the electric fan constitutes at least a part of an upper level transport portion, and wherein a further frame, a further dust-removal filter and further air-supplying means having an electric fan constitutes at least a pail of a lower level transport system, wherein the upper transporting portion can be rotated upward about one end portion so as to expose an upper area of the lower transporting portion.

11. The apparatus for transporting plate-shaped work pieces according to claim 1, wherein the air-supplying means is capable of switching an air supply amount of air that is supplied toward a lower surface portion of the transported object between a first air supply amount for contactlessly supporting the transported object and a set air supply amount that is different from the first air supply amount.

12. The apparatus for transporting plate-shaped work pieces according to claim 11, wherein the set air supply amount is less than the first air supply amount.

13. The apparatus for transporting plate-shaped work pieces according to claim 11, wherein the set air supply amount is greater than the first air supply amount.

14. The apparatus for transporting plate-shaped work pieces according to claim 1, wherein a first circulation path that allows air to flow downward is formed to the side of the air-supplying support means.

15. The apparatus for transporting plate-shaped work pieces according to claim 1, wherein a second circulation path for discharging downward the filtered air that has been supplied to the lower surface of the plate-shaped work piece is formed in the air-supplying support means at an intermediate location in the width direction, which is perpendicular to the transporting direction, of the plate-shaped work piece.

16. The apparatus for transporting plate-shaped work pieces according to claim 15, wherein the air-supplying support means has air-supplying units in which the dust-removal filter and the air-supplying means are incorporated into a single unit, and which are lined up in the transporting direction and the width direction; and
wherein the second circulation path is formed by separating the air-supplying units lined up in the width direction.

17. The apparatus for transporting plate-shaped work pieces according to claim 16, wherein the air-supplying support means is formed by the air-supplying units lined up in the transporting direction, and a third circulation path that discharges the filtered air supplied onto the lower surface of the plate-shaped work piece downward is formed by separating the air-supplying units lined up in the transporting direction.

18. The apparatus for transporting plate-shaped work pieces according to claim 15, comprising:
a discharged air amount adjustment means for adjusting the amount of air discharged over the second circulation path.

19. The apparatus for transporting plate-shaped work pieces according to claim 18, wherein the porous member has a ventilation portion that permits ventilation into the second circulation path.

20. The apparatus for transporting plate-shaped work pieces according to claim 19, wherein the discharged air amount adjustment means is provided with an adjustment plate for adjusting an extent of the opening of the ventilation portion.

21. The apparatus for transporting plate-shaped work pieces according to claim 19, wherein the porous member is partitioned in the width direction and formed by a plurality of plate-shaped portions, and the ventilation portion is formed by positioning the plurality of plate-shaped portions leaving a spacing between them in the width direction; and
wherein the discharged air amount adjustment means adjusts the spacing between the plate-shaped portions of the porous member, adjusting the amount of air discharged through the second circulation path.

22. The apparatus for transporting plate-shaped work pieces according to claim 15, further comprising:
a drive force application means for applying a drive force in the transporting direction to the plate-shaped work piece;
wherein the drive force application means is provided with a drive rotor for supporting an end side of the plate-shaped work piece in a contacting manner, a driven rotor for supporting the other end side of the plate-shaped work piece in a contacting manner, a drive mechanism for driving the drive rotor, and a transmission mechanism for transmitting the motive force of the drive mechanism to the driven rotor;
wherein the drive force application means is configured such that it applies a drive force while supporting both end portions of the plate-shaped work piece in a contacting manner with the drive rotor and the driven rotor; and
wherein the transmission mechanism is disposed in the second circulation path.

23. An apparatus for transporting plate-shaped work pieces comprising:
a frame;
a motor supported on the frame;
a fan, which is driven by the motor and which sends air upward;
a dust-removal filter disposed above the fan;
a plate-shaped porous member, which is disposed above the dust-removal filter and which has a plurality of apertures that allow air from the fan to pass upward; and
a circulation aperture formed in the porous member that allows the air to pass downward.

24. The apparatus for transporting plate-shaped work pieces according to claim 23, wherein the fan and the dust-removal filter are supported within a housing adapted to be supported on the frame and are thus incorporated into an air-supplying unit.

25. The apparatus for transporting plate-shaped work pieces according to claim 24, wherein a plurality of air-supplying units are disposed in a direction perpendicular to the transporting direction of the plate-shaped work piece, and a spacing between two adjacent air-supplying units allows air in the downward direction that has passed through the circulation aperture to pass through.

26. An apparatus for transporting plate-shaped work pieces, comprising:

a frame;

an air-supplying support means, which is supported on the frame and which supplies filtered air toward a lower surface of a plate-shaped work piece being transported so as to contactlessly support the plate-shaped work piece, wherein the air-supplying support means has a dust-removal filter for removing dust, and an air-supplying means having an electric fan for supplying filtered air toward the lower surface of the plate-shaped work piece through the dust-removal filter; and a housing supported by the frame and accommodating the dust-removal filter and the electric fan to integrate the dust-removal filter and the electric fan into a single air-supplying unit;

a drive force application means for applying a drive force in a transporting direction to the plate-shaped work piece;

wherein the drive force application means is provided with a drive rotor that contacts both end portions in a width direction, which is perpendicular to the transporting direction, of the plate-shaped work piece and applies a drive force thereto; and wherein the air-supplying support means supports a portion located between the end portions of the plate-shaped work piece.

27. The apparatus for transporting plate-shaped work pieces according to claim 26, wherein the air-supplying support means has a plurality of air-supplying units positioned in the transporting direction of the plate-shaped work pieces.

* * * * *

UNITED STATES PATENT AND TRADEMARK OFFICE
CERTIFICATE OF CORRECTION

| | | |
|---|---|---|
| PATENT NO. | : 7,108,474 B2 | Page 1 of 1 |
| APPLICATION NO. | : 10/823408 | |
| DATED | : September 19, 2006 | |
| INVENTOR(S) | : Moriya et al. | |

It is certified that error appears in the above-identified patent and that said Letters Patent is hereby corrected as shown below:

Column 21, Line 11, Claim 9, "through holes" should read -- through through holes --

Column 21, Line 19, Claim 10, "pail of a lower" should read -- part of a lower --

Signed and Sealed this

Sixth Day of March, 2007

JON W. DUDAS
*Director of the United States Patent and Trademark Office*